United States Patent
Miura et al.

(10) Patent No.: US 11,837,843 B2
(45) Date of Patent: Dec. 5, 2023

(54) LIGHT EMITTING DEVICE

(71) Applicant: NICHIA CORPORATION, Anan (JP)

(72) Inventors: Soichiro Miura, Tokushima (JP); Tatsuya Kanazawa, Anan (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 17/478,863

(22) Filed: Sep. 17, 2021

(65) Prior Publication Data
US 2022/0006255 A1    Jan. 6, 2022

Related U.S. Application Data

(62) Division of application No. 16/560,310, filed on Sep. 4, 2019, now Pat. No. 11,152,758.

(30) Foreign Application Priority Data

Sep. 6, 2018 (JP) ................................. 2018-166642
May 29, 2019 (JP) ................................. 2019-100022

(51) Int. Cl.
*H01S 5/40* (2006.01)
*H01S 5/00* (2006.01)
(Continued)

(52) U.S. Cl.
CPC ........ *H01S 5/0071* (2013.01); *H01S 5/02208* (2013.01); *H01S 5/02253* (2021.01);
(Continued)

(58) Field of Classification Search
CPC ............... H01S 5/0071; H01S 5/02208; H01S 5/02253; H01S 5/02255; H01S 5/4025; H01S 5/4031; H01S 5/4037; H01S 5/4075
See application file for complete search history.

(56) References Cited

U.S. PATENT DOCUMENTS 5,070,510 A * 12/1991 Konushi ........... H01L 21/02392
257/E21.123
6,404,542 B1 * 6/2002 Ziari ................. H01S 3/094003
359/341.33
(Continued)

FOREIGN PATENT DOCUMENTS

JP        H11352364 A    12/1999
JP        2007287610 A    11/2007
(Continued)

OTHER PUBLICATIONS

Restriction Requirement in the related U.S. Appl. No. 16/560,310, dated Feb. 22, 2021.
(Continued)

*Primary Examiner* — Michael Carter
(74) *Attorney, Agent, or Firm* — Global IP Counselors, LLP

(57) ABSTRACT

A light emitting device includes a base, a first semiconductor laser element, a second semiconductor laser element, a lens member, and a waveplate. The base has a bottom part. The first semiconductor laser element is disposed on the bottom part of the base. The second semiconductor laser element is disposed on the bottom part of the base. The second semiconductor laser element has a different polarization direction from a polarization direction of the first semiconductor laser element. The lens member is a member into which light beams from the first semiconductor element and the second semiconductor laser element enter. The waveplate is configured to change the polarization direction of light from the first semiconductor laser element.

10 Claims, 14 Drawing Sheets

(51) Int. Cl.
*H01S 5/02208* (2021.01)
*H01S 5/02255* (2021.01)
*H01S 5/02253* (2021.01)
*H01S 5/02257* (2021.01)

(52) U.S. Cl.
CPC ........ *H01S 5/02255* (2021.01); *H01S 5/4037* (2013.01); *H01S 5/4075* (2013.01); *H01S 5/005* (2013.01); *H01S 5/02257* (2021.01)

(56) References Cited

U.S. PATENT DOCUMENTS

| | | | | |
|---|---|---|---|---|
| 8,625,989 | B2* | 1/2014 | Du | H01S 5/4025 |
| | | | | 398/43 |
| 2008/0084905 | A1* | 4/2008 | Doerfel | H01S 5/02325 |
| | | | | 372/43.01 |
| 2012/0092624 | A1 | 4/2012 | Oiwa et al. | |
| 2012/0106178 | A1 | 5/2012 | Takahashi et al. | |
| 2013/0021581 | A1* | 1/2013 | Takahashi | H04N 9/3152 |
| | | | | 353/31 |
| 2013/0265561 | A1 | 10/2013 | Takahira et al. | |
| 2013/0265770 | A1 | 10/2013 | Breidenassel et al. | |
| 2016/0091785 | A1 | 3/2016 | Inoko et al. | |
| 2016/0306265 | A1* | 10/2016 | Riel | G02B 7/003 |
| 2017/0139269 | A1 | 5/2017 | Asakawa | |
| 2017/0317467 | A1 | 11/2017 | Miura et al. | |

FOREIGN PATENT DOCUMENTS

| | | |
|---|---|---|
| JP | 2012-088451 A | 5/2012 |
| JP | 2012-109201 A | 6/2012 |
| JP | 2016-040822 A | 3/2016 |
| JP | 2017090799 A | 5/2017 |
| JP | 2017-201684 A | 11/2017 |
| JP | 2017212390 A | 11/2017 |
| WO | 2012/014798 A1 | 2/2012 |
| WO | 2018021414 A1 | 2/2018 |

OTHER PUBLICATIONS

Notice of Allowance in the related U.S. Appl. No. 16/560,310, dated Jun. 23, 2021.

* cited by examiner

LIGHT EMITTING DEVICE

CROSS-REFERENCE TO RELATED APPLICATION

This application is a divisional application of U.S. patent application Ser. No. 16/560,310, filed on Sep. 4, 2019. This application claims priority to Japanese Patent Application No. 2018-166642 filed on Sep. 6, 2018, and Japanese Patent Application No. 2019-100022 filed on May 29, 2019. The entire disclosures of U.S. patent application Ser. No. 16/560, 310 and Japanese Patent Application Nos. 2018-166642 and 2019-100022 are hereby incorporated herein by reference.

BACKGROUND

The present disclosure relates to a light emitting device.

A light emitting device comprising multiple light emitting elements, such as LEDs or lasers, has been known. In some cases, optical systems for various types of light source devices such as projectors, liquid crystal displays, headlights and the like are designed by incorporating a plurality of light emitting elements. In designing such optical systems, certain conditions related to optical characteristics, such as the travelling direction of a light beam, the emission region, or the polarization direction are set.

The use of a lens for collecting, diverging, or collimating light emitted from a light emitting element has been known. Alternatively, a mirror can be provided in the beam path before the light reaches a lens. For example, Japanese Patent Publication No. 2017-212390 discloses a projector incorporating a light source device including a plurality of semiconductor laser elements, a plurality of prisms, and an optical system with which the light beams emitted by the semiconductor laser elements are reflected and are allowed to enter the lenses disposed upwards of the light source device, The beam path lengths reaching the lenses can be increased by interposing light reflecting members, such as mirrors or prisms, in a package having a limited space.

For example, Japanese Patent Publication No. 2017-90799 discloses a laser light source for a display device where the polarization directions of a red laser light source, a blue laser light source, and a green laser light source are aligned.

SUMMARY

As in the case of the light source device disclosed in Japanese Patent Publication No. 2017-212390, the light beam diverges as the beam path length is increased by interposing a light reflecting member.

A light emitting device according to one aspect of the present disclosure includes a base, a first semiconductor laser element, a second semiconductor laser element, a lens member, and a waveplate. The base has a bottom part. The first semiconductor laser element is disposed on the bottom part of the base. The second semiconductor laser element is disposed on the bottom part of the base. The second semiconductor laser element has a different polarization direction from a polarization direction of the first semiconductor laser element. The lens member is a member into which light beams from the first semiconductor laser element and the second semiconductor laser element enter. The waveplate is configured to change the polarization direction of light from the first semiconductor laser element.

According to the present disclosure, a light emitting device with reduced beam divergence angle can be provided.

DESCRIPTION

Figure 1:
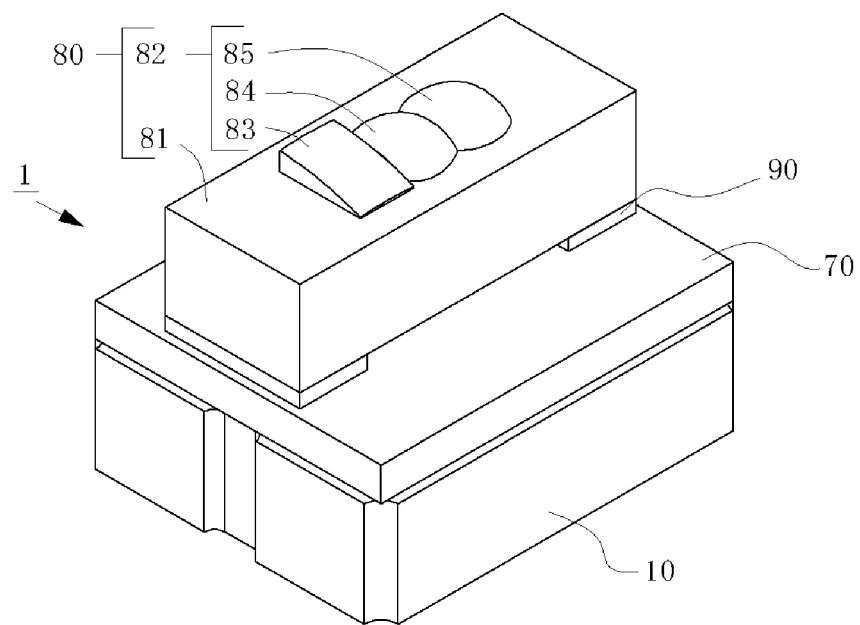
FIG. 1 is a perspective view of a light emitting device according to a first embodiment.

Certain embodiments of the present invention will be explained below with reference to the drawings. However, the embodiments described below are for giving shape to the technical ideas of the present invention and are not intended to limit the present invention. In the explanation below, moreover, the same designations and reference numerals show the same or similar components for which detailed explanation will be omitted as appropriate. The sizes of and positional relationship between the members might be exaggerated for clarity of explanation.

First Embodiment

Figure 2:
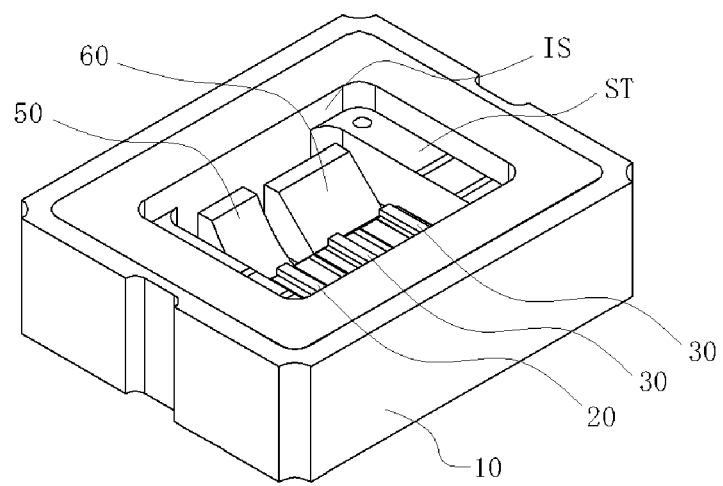
FIG. 2 is a perspective view of the light emitting device according to the first embodiment viewed in the same angle as in FIG. 1 with a portion of the structure removed.
Figure 3:
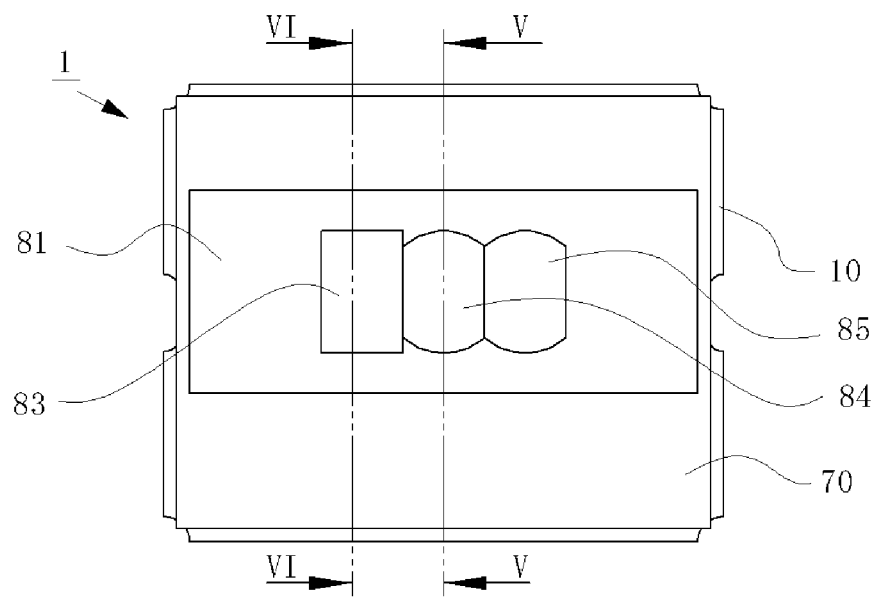
FIG. 3 is a top view of the light emitting device according to the first embodiment.
Figure 4:
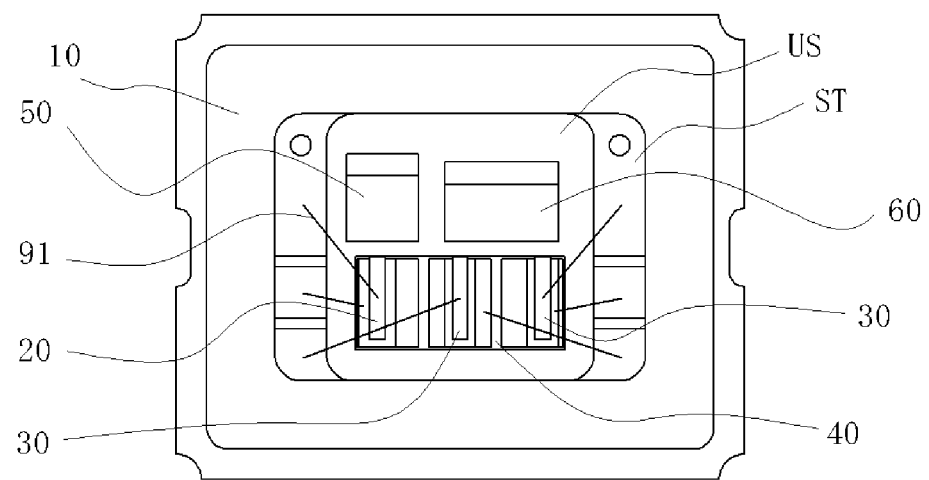
FIG. 4 is a top view of the light emitting device according to the first embodiment corresponding to FIG. 2.
Figure 5:
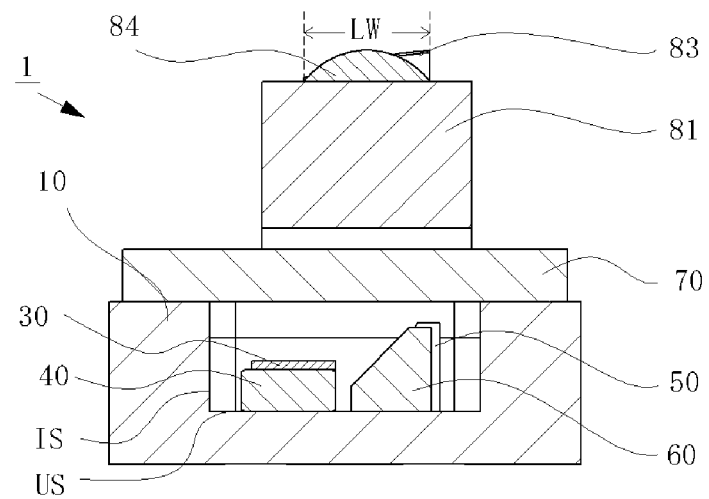
FIG. 5 is a cross-sectional view of the light emitting device according to the first embodiment taken along line V-V in FIG. 3.
Figure 6:
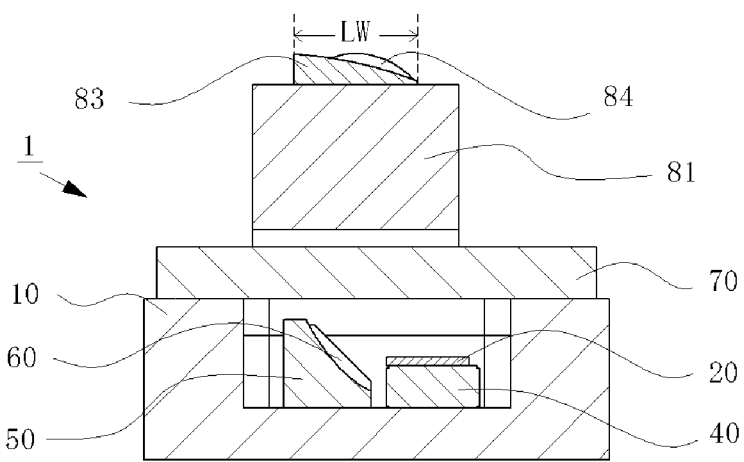
FIG. 6 is a cross-sectional view of the light emitting device according to the first embodiment taken along line VI-VI in FIG. 3.

FIG. 1 to FIG. 6 are diagrams for illustrating the structure of a light emitting device 1 according to a first embodiment. FIG. 1 is a perspective view of the light emitting device 1 viewed from the side from which light exits. FIG. 2 is a perspective view of the light emitting device 1 visualizing the space where the semiconductor laser elements are disposed by removing a portion of constituent members when viewed in the same direction as in FIG. 1. FIG. 3 is a top view of the light emitting device 1 shown in FIG. 1 assuming that the side from which light exits is the upper surface. FIG. 4 is a top view of the light emitting device 1 shown in FIG. 2 assuming that the side from which light exits is the upper surface. FIG. 5 is a cross-sectional view of the light emitting device 1 taken along line V-V in FIG. 3. FIG. 6 is a cross-sectional view of the light emitting device 1 taken along line VI-VI in FIG. 3. The light emitting device 1, including wires, is shown in FIG. 4, but the wires are omitted in the other drawings so as to reduce obscurity.

The light emitting device 1 includes constituent elements such as a base 10, a single first semiconductor laser element 20, two second semiconductor laser elements 30, a submount 40, a first light reflecting member 50, a second light reflecting member 60, a cover member 70, a lens member 80, bonding parts 90, and wires 91. The lens member 80 may be disposed on another device instead of the light emitting device 1.

A light emitting device may be constructed only with a first semiconductor laser element 20 among the first and second semiconductor laser elements. In the case where there is no second semiconductor laser element 30, the second light reflecting member 60 does not have to be provided. A plurality of first semiconductor laser elements 20 may be arranged. Similarly, one or multiple second semiconductor laser elements 30 may be arranged. Depending on the material or structure of the base 10, a semiconductor laser element can be mounted without a submount 40.

Each constituent element will be explained next.

The base 10 has a bottom part which forms the bottom surface of the base 10, and a frame part which forms the lateral surfaces of the base 10. The frame part has inner lateral surfaces IS. The inner lateral surfaces IS and the upper surface US of the bottom part form the base with a recessed structure where the central portion is recessed. Stepped parts ST are provided at certain inner surfaces of the frame part. The stepped parts ST may be provided across all inner lateral surfaces. A metal film is disposed on the upper surface of a stepped part.

The base 10 may be composed of a ceramic as a main material. A metal instead of ceramic may be used to form the base. Example materials as main materials for the base 10 include: ceramics such as aluminum nitride, silicon nitride, aluminum oxide, or silicon carbide; metals such as copper, aluminum, or iron; and a composite material such as copper molybdenum, copper diamond, or copper tungsten. Alternatively, the base 10 may be formed by providing the bottom part and the frame part as separate members composed of different main materials, and joining the bottom part and the frame part together. This, for example, includes employing as a main material different metals for the bottom part and the frame part, or using a bottom part composed of a metal as a main material and a frame part composed of a ceramic as a main material.

The first semiconductor laser element 20 and the second semiconductor laser elements 30 emit laser beams. The laser beams emitted from these semiconductor laser elements are divergent beams, forming an elliptical far field pattern (hereinafter referred to as FFP) in a plane parallel to the emission end surface. An FFP is identified by the luminous intensity distribution of a beam irradiated at a plane located at a distance in some degree from and parallel to the emission end surface. The shape of an FFP can be identified as a region where light having intensity of $1/e^2$ higher relative to the peak intensity value is distributed. The beam forming an FFP is referred to as the major portion of light.

Figure 7:
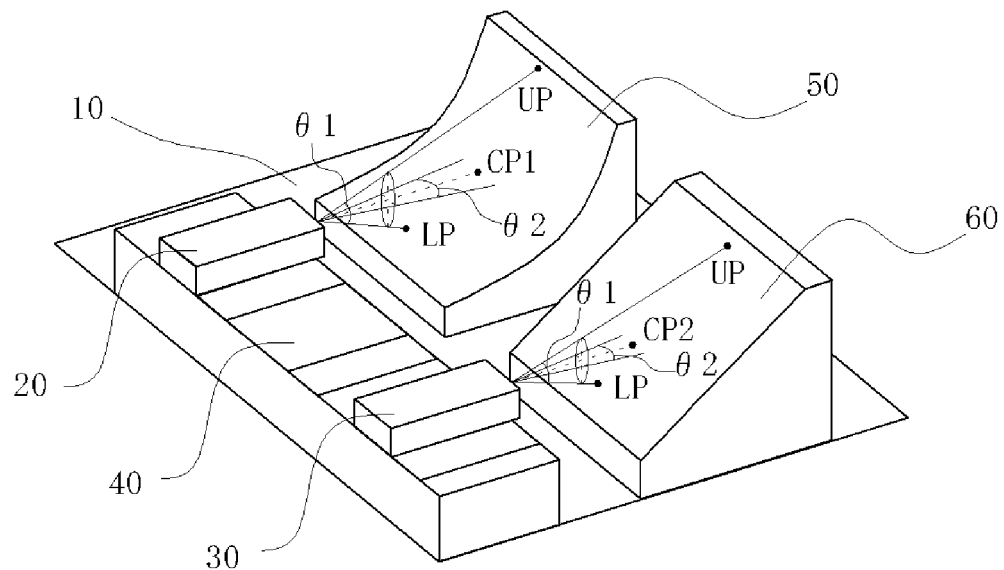
FIG. 7 is a schematic diagram showing the major portions of the emitted light beams from a first semiconductor laser element and a second semiconductor laser element of the light emitting device according to the first embodiment.

FIG. 7 is a schematic diagram showing the major portions of the light beams emitted from a first semiconductor laser element 20 and a second semiconductor laser element 30 of the light emitting device 1. The diagram shows only a portion of the light emitting device 1 needed for the explanation. As shown in FIG. 7, an FFP is elliptical-shaped, greater in length in the stacking direction of active layer-containing semiconductor layers than the direction perpendicular thereto. In the description herein, the divergence of the beam corresponding to the major axis diameter of the elliptical shape is referred to as divergence in the vertical direction, and the divergence of the beam corresponding to the minor axis diameter is referred to as divergence in the lateral direction.

In the space into which the major portion of a light beam travels, the half value of the angle formed by the rays of light traveling from the emission end surface to both edges of the major diameter of the elliptical shape is referred to as the vertical beam divergence angle, and the half value of the angle formed by the rays of light traveling from the emission end surface to both edges of the minor diameter of the elliptical shape is referred to as the lateral beam divergence angle. Based on FIG. 7, for both the first and second semiconductor laser elements, the vertical beam divergence angle is denoted as $\theta 1/2$ and the lateral beam divergence angle $\theta 2/2$. The vertical beam divergence angle is larger than the lateral beam divergence angle for both the first and second semiconductor laser elements 20 and 30.

The light emitted from the first semiconductor laser element 20 has larger vertical beam divergence angle than that of the light emitted from the second semiconductor laser element 30. Depending on the beam divergence angle of the semiconductor laser element employed, in order to effectively apply the light emitting device 1 of the first embodiment, it is preferable for the first semiconductor laser element 20 and the second semiconductor laser elements 30 to satisfy the condition such that the vertical beam divergence angle of the light emitted from the first semiconductor laser element 20 is 10 or more degrees larger. The difference in the vertical beam divergence angle of the laser beams between the first semiconductor laser element 20 and the second semiconductor laser elements 30 can be set, for example, to 30 degrees at most.

For example, a red light emitting semiconductor laser element is employed for the first semiconductor laser element 20, and a blue light emitting semiconductor laser element and a green light emitting semiconductor laser element are employed for the second semiconductor laser elements 30. Besides employing semiconductor laser elements of these three colors, a different color combination may be employed.

The peak emission wavelength of red light is preferably in the range of from 605 nm to 750 nm, more preferably in the range of from 610 nm to 700 nm. Examples of red light emitting semiconductor laser elements include those including an InAlGaP-based, GaInP-based, GaAs-based, or AlGaAs-based semiconductor. For a semiconductor laser element including these semiconductors, output reduction due to heat tends to occur as compared to a semiconductor laser element including a nitride semiconductor. Considering this point, it is preferable to provide two or more waveguide areas, Increasing the waveguide areas can increase heat dissipation area, thereby attenuating the output reduction of a semiconductor laser element.

The peak emission wavelength of blue light is preferably in the range of from 420 nm to 494 nm, more preferably in the range of from 440 nm to 475 nm. Examples of blue light emitting semiconductor laser elements include those including nitride semiconductors. For nitride semiconductors, for example, GaN, InGaN, and AlGaN may be used.

The peak emission wavelength of green light is preferably in the range of from 495 nm to 570 nm, more preferably in the range of from 510 nm to 550 nm. Examples of green light emitting semiconductor laser elements include those including nitride semiconductors. For nitride semiconductors, for example, GaN, InGaN, and AlGaN can be used.

The submount 40 is constructed as a rectangular parallelepiped. The shape, however, is not required to be a rectangular parallelepiped. The submount 40 can be formed, for example, with silicon nitride, aluminum nitride, or silicon carbide. The materials that can be used are not required to be these. Moreover, a metal film is disposed on a portion of the submount 40.

The first and second light reflecting members 50 and 60 each have a bottom surface, lateral surfaces substantially perpendicularly extending from the bottom surface, and an upper surface meeting the lateral surfaces at the opposite side of the bottom surface. A portion of the upper surface is not in parallel to the bottom surface. A portion of the upper surface is in parallel to the bottom surface. A light reflecting surface for reflecting light is formed at least in the area that is not in parallel with the bottom surface. The light reflecting surface of the first light reflecting member 50 and the light reflecting surface of the second light reflecting member 60 have different shapes. The first reflecting member 50 has a concave light reflecting surface, and the second reflecting member 60 has a flat light reflecting surface. The second light reflecting member 60 is designed such that the bottom surface and the flat light reflecting surface form a 45 degree angle.

The first and second light reflecting members 50 and 60 can be formed by using a heat resistant material as a main material for the exterior and a high reflectance material for the surface of the exterior where the light reflecting surface is to be provided. For the main material, glass, such as quartz, borosilicate glass (BK7), or the like, metals such as aluminum or the like, or Si or the like, can be employed. For the light reflecting surface, metals, such as Ag, Al, or the like, dielectric multilayer film, such as $Ta_2O_5/SiO_2$, $TiO_2/SiO_2$, $Nb_2O_5/SiO_2$, or the like, can be employed. The exterior of the first and the second light reflecting members 50 and 60 may be formed by using a material with high reflectance such as metals while omitting the light reflecting film. The light reflecting surfaces of the first and the second light reflecting members 50 and 60 can be designed to have reflectance of at least 99% for the peak wavelengths of the laser beams to be reflected. The reflectance can be set to 100% at most or less than 100%.

The cover member 70 is constructed as a rectangular parallelepiped. The cover member 70, moreover, is light transmissive as a whole. It may have a non-light transmissive area. The shape is not required to be a rectangular parallelepiped. The cover member 70 can be formed by using sapphire as a main material. A metal film is disposed in one area. Sapphire is a material having a relatively high refractive index and relatively high strength. For the main material, glass or the like, for example, can be used other than sapphire.

The lens member 80 has three lens parts 82 having a lens shape, and a non-lens part 81. The lens member 80 is structured in the form of linking the three lens parts 82 on the non-lens part 81. For example, by using a mold having such a shape, the lens member 80 integrally forming the non-lens part 81 and the lens parts 82 can be manufactured. Manufacturing such an integrally composed lens part 80 is good in terms of production efficiency.

Alternatively, the lens member 80 may be constructed by separately preparing a member shaped as a non-lens part 81 and members shaped as lens parts 82 followed by bonding the lens parts 82 onto the plane formed by the non-lens part 81. For the lens member 80, glass such as BK7, B270, borosilicate glass, or the like can be used.

The flat surface overlapping the surface of the non-lens part 81 on which the lens parts 82 are provided is referred to as the interface of the lens parts 82 or the non-lens part 81. When the term "interface of the lens parts 82" is used, it refers to the surfaces of the lens parts 82 overlapping the interface. Even in the case where the lens parts 82 and the non-lens part 81 are integrally formed, the regions virtually overlapping the interface can be considered as such. Moreover, in the case where the lens member 80 has no non-lens part 81, the flat surface opposing the surfaces of the lens parts 82 having lens shapes (i.e., curved surface structures) is considered as the interface of the lens parts 82.

The bonding parts 90 are formed by solidifying a bonding material. It's preferable to use a UV curable resin for the bonding parts 90. A UV curable resin can secure the lens member 80 at a given position because it can harden in a relatively short time without involving heating.

The light emitting device 1 manufactured by using these constituent elements will be explained next.

A first semiconductor laser element 20 and two second semiconductor laser elements 30 are disposed via a submount 40 on the upper surface US of the bottom part, which is the bottom surface of the base 10. In the case where a submount 40 is not interposed, the first and second semiconductor laser elements are directly disposed on the upper surface US of the bottom part. In the light emitting device 1. a red first semiconductor laser element 20, a blue second semiconductor laser element 30. and a green second semiconductor laser element 30 are disposed.

In the light emitting device 1, the blue light emitting second semiconductor laser element 30 is positioned in the center which is interposed by the red light emitting first semiconductor laser element 20 and the green light emitting second semiconductor laser element 30. This takes into consideration the fact that the red light emitting first semiconductor laser element 20 is inferior to the others in terms of optical output under the heated condition. This also takes into consideration the fact that the amount of heat generated by the blue light emitting second semiconductor laser element 30 is smaller than that of the green light emitting second semiconductor laser element 30. In other words, considering such thermal characteristics, the one having the best characteristics among the three semiconductor laser elements is preferably positioned in the middle.

Furthermore, a single first light reflecting member 50 and a single second light reflecting member 60 are disposed on the upper surface US of the bottom part. The upper surface US of the bottom part is bonded to the bottom surfaces of the first and second light reflecting members. The first and second light reflecting members are disposed so that the major portion of the light beam emitted from the first semiconductor laser element 20 irradiates the light reflecting surface of the first light reflecting member 50, and the major portions of the light beams emitted from the second semiconductor laser elements 30 irradiate the second light reflecting member 60.

Allowing for reflection using the light reflecting members can increase the beam path lengths as compared to cases where no light reflecting member is provided. The effect of mounting misalignment between the light reflecting members and the semiconductor laser elements can be reduced when the beam path lengths are greater. Two second light reflecting members 60 may be provided to individually correspond to two second semiconductor laser elements 30 instead of a single second light reflecting member 60 corresponding to two second semiconductor laser elements 30.

The frame part of the base 10 surrounds the first and second semiconductor laser elements 20 and 30 disposed on the upper surface US of the bottom part, the submount 40, and the first and second light reflecting members 50 and 60. Accordingly, these constituent elements are arranged on the upper surface US of the bottom part inward of the frame part. Each of the wires 91 at one end are connected to the metal film disposed on the upper surfaces of the stepped parts ST of the frame part. Each of the wires 91 at the other end are connected to the first and second semiconductor laser elements. This can electrically connect the first and second semiconductor laser elements 20 and 30 to a power supply externally provided.

The stepped parts ST are not provided in certain areas of the inner lateral surfaces IS of the frame part of the base 10. These areas are located at the lateral surface of the base 10 opposing the lateral surface of the first semiconductor laser element 20 close to the first light reflecting member 50, and the lateral surface of the base 10 opposing the lateral surface of the first light reflecting member 50 closet to the first semiconductor laser element 20. If a stepped part ST were positioned at the lateral surface of the base 10 which is on the opposite side of the lateral surface close to the first semiconductor laser 20, the wire 91 connected to the first semiconductor laser element 20 would span over the first light reflecting member 50. That is why no stepped part ST for the purpose of establishing an electrical connection is formed there. By not forming stepped parts ST in certain areas, a smaller light emitting device 1 can be produced.

On the upper surface of the submount 40, three semiconductor laser elements are disposed. The submount 40 may be disposed for the first and second semiconductor laser elements 20 and 30 on a one-to-one basis. The bottom surface of the submount 40 is bonded to the bottom pail of the base 10, and the upper surface of the submount is bonded to the semiconductor laser elements. The semiconductor laser elements are bonded to the metal film disposed on the upper surface of the submount 40 via a conductive bonding material such as Au—Sn or the like.

From a heat dissipation perspective, using a material having higher thermal conductivity than the bottom part of the base 10 allows the submount 40 to achieve a more enhanced effect as a heat dissipater. For example, in the case of employing a material which includes a nitride semiconductor for the semiconductor laser elements and aluminum nitride as a main material for the base 10, aluminum nitride or silicon carbide may be used for the submount 40. In the case of using aluminum nitride for both the base 10 and the submount 40, aluminum nitride having higher conductivity than the aluminum nitride used for the base 10 may be employed for the submount 40.

Furthermore, the shape of the submount 40 is designed so that the heights of the semiconductor laser elements 20 and 30 from the bottom part are the same. Moreover, it is designed so that the distance between the submount 40 under the first semiconductor laser 20 and the first light reflecting member 50 is the same as the distance between the submount 40 under the second semiconductor lasers 30 and the second light reflecting member 60. A manufacturing tolerance may occur due to a component tolerance, position tolerance, or the like, even if manufactured with the same design. When heights, lengths, or positions in the light emitting device 1 are described as being the same, these tolerances in permissible ranges are included. It's allowed that these heights and distances do not have to be the same.

The distance between the emission end surface of the first semiconductor laser element 20 and the first light reflecting member 50 is designed to be the same as the distance between the emission end surfaces of the second semiconductor laser elements 30 and the second light reflecting member 60. The emission end surfaces of the first and second semiconductor laser elements are designed to be located in the same plane. That is, they are designed using two virtual parallel planes such that the emission end surfaces of the first and second semiconductor laser elements are located in one of the two virtual parallel planes, and the lateral surface of the first light reflecting member 50 closest to the first semiconductor laser element 20 and the lateral surface of the second light reflecting member 60 closest to the second semiconductor laser elements 30 are located in the other virtual parallel plane.

The cover member 70 is bonded to the frame part at the upper surface of the base 10 which opposes the bottom surface (first surface) of the cover member 70, covering the frame formed by the inner surfaces IS of the frame part. A metal film is disposed in the area of the lower surface of the cover member 70 that is to be joined with the base 10, and the cover member 70 is secured to the position via Au-Sn or the like. In the case of covering the frame using a rectangular parallelepiped cover member 70, the height from the bottom surface of the base 10 to the upper surface of the frame is higher than the heights of the first and second semiconductor laser elements 20 and 30 from the bottom surface of the base 10, and higher than the heights of the first and second light reflecting members 50 and 60.

The base 10 and the cover member 70 after being joined together make the closed space hermetically sealed. Hermetically sealing the space in this manner can attenuate that the dust, such as organic matter or the like is collected at the emission end surfaces of the first and second semiconductor laser elements.

The light reflected by the light reflecting surfaces of the first and second light reflecting members 50 and 60 enters the cover member 70, The cover member 70 is designed to have a light transmissive region through which the reflected light enters and is output so that the reflected light of at least the major portion of the light passes through the cover member 70 and is output from the upper surface. In the present disclosure, being light transmissive means a transmittance of at least 80%. In other words, the major portions of the light beams reflected by the light reflecting surfaces pass through the cover member 70 which is transmissive for the wavelength ranges of the light beams from the first and second semiconductor laser elements 20 and 30, and are output from the hermetically sealed space.

The higher the refractive index of the material configuring the region of the cover member 70 where light beams pass, the more effective it is in attenuating beam divergence. For example, the cover member 70 is preferably constructed with sapphire at least in the regions through which the major portion of the light beam from the first semiconductor laser element reflected by the light reflecting surface of the first light reflecting member passes through, and which the major portion of the light beam from the second semiconductor laser element reflected by the light reflecting surface of the second light reflecting member passes through.

The bonding parts 90 are formed in the regions of the upper surface (second surface) of the cover member 70 where the cover member 70 is bonded to the lens member 80. The bonding parts 90 are formed between the cover member 70 and the lens member 80 by applying an adhesive material in the bonding portion of the upper surface of the cover member 70, placing the lower surface of the lens member 80 thereto, and hardening the adhesive material. The bonding parts 90 are formed to a certain thickness so that the cover member 70 does not contact the lens member 80. The thickness is designed by considering the position and component tolerances. This enables bonding of the lens member 80 to the cover member 70 upon adjusting the position and height of the lens member 80 in the event of a deviation in the position of the light passing through the cover member 70 attributable to positional deviation of the semiconductor laser elements and the light reflecting members mounted on the base 10.

The bonding parts 90, moreover, are not disposed across the entire upper surface of the cover member 70 or the entire lower surface of the lens member 80. but are disposed so as not to interfere with the paths of the light beams emitted from the first and second semiconductor laser elements 20 and 30. Accordingly, the bonding parts 90 are not formed on a region of the lower surface of the lens member 80 corresponding to the regions where the lens parts 82 of the lens member 80 are formed, but are formed in the outer peripheral regions of the lens member 80.

The lens member 80 is bonded to the cover member 70 via the bonding parts 90 on the cover member 70. The lens member 80 is positioned so that the lens parts 82 of the lens member 80 are located on the surface opposing the surface that is bonded to the cover member 70. The three lens parts 82 of the lens member 80 are positioned to individually correspond to the three semiconductor laser elements arranged on the bottom part.

That is, the upper surfaces of the three lens parts 82 are the surfaces from which the beams from the three semiconductor laser elements entering the lens member 80 are output. The major portion of the light beam emitted from the first semiconductor laser element 20 is reflected by the light reflecting surface of the first light reflecting member 50, enters the lens member 80 through the cover member 70, passes through a first lens part 83, which is one of the three lens parts 82, and is output from the lens member 80.

The major portion of the light beam emitted from one of the two second semiconductor laser elements 30 is reflected by the light reflecting surface of the second light reflecting member 60, enters the lens member 80 through the cover member 70, passes through a second lens part 84 which is one of the three lens parts 82 different from the first lens part 83, and is output from the lens member 80.

The major portion of the light beam emitted from the other second semiconductor laser element 30 is reflected by the light reflecting surface of the second light reflecting member 60 enters the lens member 80 through the cover member 70, passes through a third lens part 85 which is the remaining one of the three lens parts 82, and is output from the lens member 80.

As described above, the lens parts 82 are formed so that each lens part 82 corresponds to a semiconductor laser element. Accordingly, depending on the number of semiconductor laser elements provided in the light emitting device 1, the number of lens parts 82 to be formed can vary. For example, in the case where a light emitting device 1 is provided with only one semiconductor laser element, the lens member 80 can have a single lens part 82. That is, the lens member can be provided with a single or multiple lens parts 82.

The lens shape of each lens part 82 is designed so that the light beam from the corresponding semiconductor laser element is collimated when it is output. In the light emitting device 1, the first to third lens parts 83 to 85 have different lens shapes, but this indicates that a plurality of lens parts 82 can have the same lens shape. A lens shape may be designed to control the travelling direction of light for the purpose of collecting light, or the like, other than collimating light.

In the case where the non-lens part 81 and each of the first to third lens parts are separately prepared for the lens member 80, the non-lens part 81 may be bonded onto the cover member 70 using an adhesive, followed by disposing and bonding each lens part 82 on the upper surface of the non-lens part 81. In this case, the positions of the lens parts 82 can be determined based on the results of measuring the positions and travelling directions of the light beams from the first and second semiconductor laser elements being output from the non-lens part 81.

Figure 8:
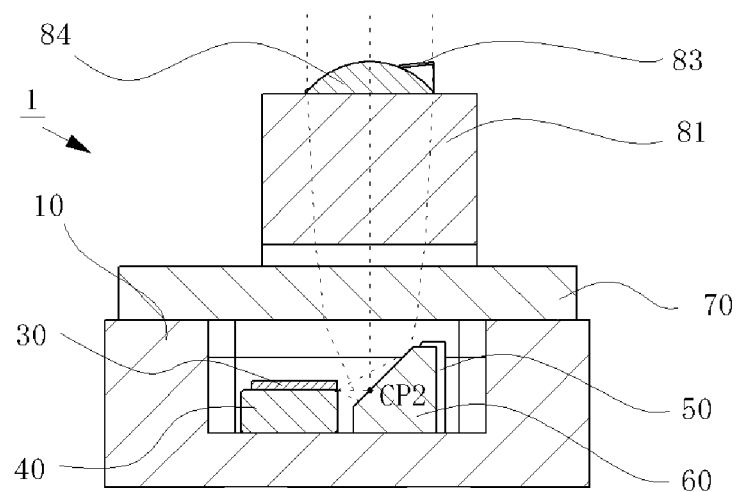
FIG. 8 is a diagram illustrating the travelling paths of the rays of light emitted from a second semiconductor laser element and exiting from the lens member according to the light emitting device of the first embodiment.

How the paths of the light beams emitted from the semiconductor laser elements in the light emitting device 1 constructed as above are controlled will be explained next. FIG. 8, based on the cross-sectional view in FIG. 5, is a diagram illustrating the paths of the rays of light beam from the second semiconductor laser element 30 being output from the lens member 80.

Figure 9:
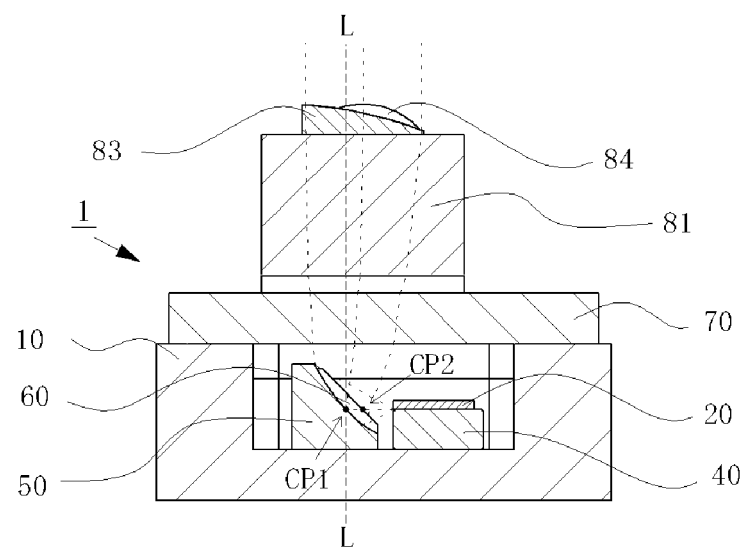
FIG. 9 is a diagram illustrating the travelling paths of the rays of light emitted from a first semiconductor laser element and exiting from the lens member according to the light emitting device of the first embodiment.

FIG. 9, based on the cross-sectional view in FIG. 6, is a diagram illustrating the paths of the rays of light from the first semiconductor laser element 20 being output from the lens member 80.

In the present embodiment, with respect to each of the first and second semiconductor laser elements 20 and 30, the ray of light in the major portion of the light beam emitted from the semiconductor laser element that irradiates the light reflecting surface at the shortest distance position from the emission end surface of the semiconductor laser element is referred to as the lower end ray. The ray of light in the major portion of the light beam emitted from the semiconductor laser element that irradiates the light reflecting surface at the longest distance position from the emission end surface of the semiconductor laser element is referred to as the upper end ray. The ray of light advancing in the direction perpendicular to the emission end surface of each semiconductor laser element, in other words, the ray of light traveling along the optical axis, is referred to as the central ray. Moreover, the angle formed by the straight line in the travelling direction of the upper end ray and the straight line in the travelling direction of the lower end ray is referred to as the angle formed by the upper end ray and the lower end ray.

Using the example shown in FIG. 7, in the light beam emitted from a semiconductor laser element forming an elliptical FFP, the ray of light passing the end of the major diameter of the ellipse closer to the base 10 is the lower end ray, and the ray of light passing the other end closer to the cover member 70 is the upper end ray.

The ray of light travelling in the center of the ellipse is the central ray. In the case where some of the rays of the entire light in the direction from the upper end to the lower ends forming an FFP do not irradiate the light reflecting surface, the rays of light at both ends of the major diameter of the ellipse are not aligned with the upper and lower end rays.

In FIG. 7, the position where the upper end ray irradiates the light reflecting surface is denoted as UP, and the position where the lower end ray irradiates the light reflecting surface is denoted as LP. The position where the central ray from the first semiconductor laser element 20 irradiating the light reflecting surface of the first light reflecting member 50 is denoted as CP1, and the position where the central ray from the second semiconductor laser element 30 irradiating the light reflecting surface of the second light reflecting member 60 is denoted as CP2.

Furthermore, the region of a constituent element of the light emitting device 1 irradiated by the light passing through the major diameter of an ellipse is referred to as the region corresponding to the major diameter of the light in the constituent element.

For example, the region of the light reflecting surface of the first light reflecting member 50 irradiated by the light from the first semiconductor laser element 20 passing through the major diameter of an elliptical FFP will be referred to as, for example, the region corresponding to the major diameter of the light beam emitted from the first semiconductor laser element 20 in the light reflecting surface of the first light reflecting member 50. Accordingly, what is referred to as a region here includes a line-like region that can be a straight or curved line-like region depending on the shape of the constituent element.

A region corresponding to the major diameter can similarly be identified in the constituent elements where light enters, such as the cover member 70, the lens member 80, or the lens parts 82 of the lens member 80, in addition to the first and second light reflecting members 50 and 60. In the case where the region corresponding to the major diameter of light in a constituent element is a straight line, the direction parallel to the straight line is referred to as the direction corresponding to the major diameter of light in the constituent element. A similar expression applies to the minor diameter by replacing the major diameter with the minor diameter.

In FIG, 8 and FIG. 9, the paths of the rays of light from the semiconductor laser elements being output from the lens member 80 are indicated by dotted lines. The three dotted lines in FIG. 8 show the paths of the upper end ray, the central ray, and the lower end ray emitted from the second semiconductor laser element 30. The three dotted lines in FIG. 9 show the paths of the upper end ray, the central ray, and the lower end ray emitted from the first semiconductor laser element 20. FIG. 9 also shows an auxiliary line L which is a straight line parallel to the travelling direction of the central ray emitted from the second semiconductor laser element 30 after being reflected by the light reflecting surface of the second light reflecting member 60 and passing the irradiation point CP1 of the central ray emitted from the first semiconductor laser element 20.

In the light emitting device 1, the light beams emitted from the first and second semiconductor laser elements are reflected by the first and second light reflecting members before entering the cover member 70 from the hermetically sealed space. The light beams passing through the cover member 70 pass through the space between the cover member 70 and the lens member 80 before entering the lens member 80. The light entering the lens member 80 passes through the lens parts 82 to exit from the light emitting device 1.

The light reflecting surface of the first light reflecting member 50 narrows the divergence in the vertical direction of the light from the first semiconductor laser element 20. In other words, the light reflecting surface reflects the light emitted from the first semiconductor laser element 20 such that a beam divergence angle of the reflected light is smaller than a beam divergence angle of the light irradiating the light reflecting surface with respect to the vertical direction of the light beam.

In the present disclosure, the angle formed by the upper end ray and the lower end ray emitted from the emission end surface of the first semiconductor laser element 20 reaching the light reflecting surface is referred to as the beam divergence angle of the light irradiating the light reflecting surface in the vertical direction. The angle formed by the upper end ray and the lower end ray reflected by and travelling from the light reflecting surface is referred to as the beam divergence angle of the reflected light in the vertical direction.

In the present disclosure, the angle formed by the upper end ray and the lower end ray includes the central ray.

On the other hand, because the light reflecting surface of the second light reflecting member 60 is flat, the angle formed by the upper end ray and the lower end ray remains unchanged for the light reaching the light reflecting surface (the beam divergence angle of the light irradiating the light reflecting surface in the vertical direction) and the light travelling from the light reflecting surface (the beam divergence angle of the reflected light in the vertical direction).

The light reflecting surface of the first light reflecting member 50 narrows the divergence of the light emitted from the first semiconductor laser element 20 in the vertical direction, but does not collimate the light. That is, it is designed so that the beam divergence angle of the reflected light in the vertical direction will not become zero degrees. As shown in FIG. 9, furthermore, the light reflecting surface of the first light reflecting member 50 in the light emitting device 1 is designed so as to allow the reflected light to be divergent to some extent.

Divergent light is defined as that satisfying the relationship such that the distance between two different points of the same beam path length passed by the rays of light from a semiconductor laser increases as the beam path length increases. Accordingly, in the light emitting device 1, this relationship is satisfied at least before the light beam reflected by a light reflecting surface enters the cover member 70. For example, in the case where the light beam from a focus is reflected by a hyperboloidal reflecting surface, the reflected light is divergent.

If designed to collimate reflected light, the light entering the lens member 80 would already be collimated, making the first lens part 83 unnecessary. In the event that the mounting positions or the like of the first semiconductor laser element 20 and the first light reflecting member 50 deviate from the design values, the impact of such a deviation could not be compensated for even if the mounting position or the height of the lens member 80 were adjusted. In contrast, designing the shape of the light reflecting surface of the first light reflecting member 50 such that the light is divergent while reducing the beam divergence through reflection allows the first lens part 83 of the lens member 80 to adjust the output light.

The shape of the light reflecting surface of the first light reflecting member 50 may be configured such that the reflected light is convergent instead of divergent. Convergent light is defined as that satisfying the relationship such that the distance between two different points of the same beam path length passed by the rays of light decreases as the beam path length increases. For example, in the case where the light beam from a focus is reflected by an elliptical reflecting surface, the reflected light is convergent light. In the case where the light beam from a focus are reflected by a paraboloidal reflecting surface, the reflected light is collimated.

In the light emitting device 1, the beams from the second semiconductor laser elements 30 are divergent until they exit from the lens member 80, thus the beam from the first semiconductor laser element 20 is made to be consistent therewith. This can reduce the impact of a mounting misalignment. Furthermore, the curvature of the light reflecting surface of the first light reflecting member 50 can be reduced when designed to diverge light as compared to converging light. The impact of a mounting misalignment can be reduced when the curvature is smaller.

For example, in the light emitting device 1, the shape of the curved light reflecting surface can be designed so as to narrow the angle formed by the upper end ray and the lower end ray to the range that is greater than zero degrees, but 20 degrees at most, with respect to the semiconductor laser beam having the vertical beam divergence angle of 55 degrees or greater.

The light reflecting surface of the first light reflecting member 50 is designed to have a cylindrical surface so as to be curved in the direction corresponding to the major diameter of the beam from the first semiconductor laser element 20 and be straight in the direction corresponding to the minor diameter of the beam. For this reason, component and position tolerances for the first semiconductor laser element 20 and the first light reflecting member 50 in the direction of the minor diameter do not affect the travelling direction of the light reflected by the light reflecting surface in the direction of the major diameter.

The light reflecting surface of the first light reflecting member 50 that is a cylindrical surface does not change the beam divergence angle of the reflected light in the lateral direction. Such a shape can be considered as one focusing on the control accuracy of the beam divergence in the vertical direction rather than controlling the beam divergence in the lateral direction because the first and second semiconductor laser elements in the light emitting device 1 emit laser beams forming an FFP with smaller the lateral beam divergence angle than the vertical beam divergence angle.

The light reflecting surface of the first light reflecting member 50 may be designed to narrow not only the beam divergence in the vertical direction, but also the beam divergence in the lateral direction. For example, it can be shaped to also have a curvature in the lateral direction, such as a spherical surface or a toroidal surface, instead of a cylindrical surface.

The distance from the emission end surface of the first semiconductor laser element 20 to the position CP1 on the light reflecting surface of the first light reflecting member 50 where the central ray irradiates is greater than the distance from the emission end surface of the second semiconductor laser element 30 to the position CP2 on the light reflecting surface of the second light reflecting member 60 where the central ray of the second semiconductor laser element 30 irradiates. That is, the central ray of the first semiconductor laser element 20 is reflected at a more distant position.

Figure 10:
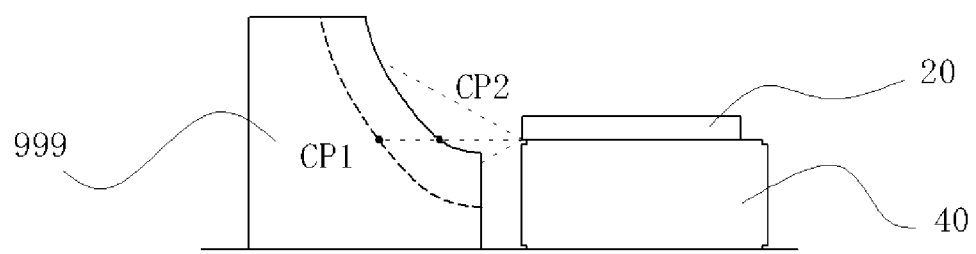
FIG. 10 is a diagram illustrating the light reflecting surface of the first light reflecting member in the case where the distances to the irradiation points for the central rays from the first and second semiconductor laser elements are aligned.

FIG. 10 is a diagram showing the light reflecting surface of the first light reflecting member 999 in the case of matching the distance to the irradiation point of the central ray of the first semiconductor laser element 20 to the distance to the position CP2 irradiated by the central ray of the second semiconductor laser element 30. The broken line is a virtual line indicating the shape of the light reflecting surface of the first light reflecting member 50. As shown in FIG. 10, the light reflecting surface is smaller in the first light reflecting member 999 with the matched distance to the CP2 than that of the first light reflecting member 50.

Accordingly, when the vertical beam divergence angle is large, a larger amount of light can be irradiated at the light reflecting surface by positioning the CPI farther than the CP2 compared to a case where the CPI is positioned at the same distance as the CP2.

The light reflecting surface of the first light reflecting member 50 is designed to reflect the central ray from the first semiconductor laser element 20 in the direction that forms an acute angle with the optical axis, not perpendicular to the optical axis. On the other hand, the light reflecting surface of the second light reflecting member 60 is designed to reflect the central ray from the second semiconductor laser element 30 in the direction perpendicular to the optical axis. Moreover, when a reflection angle is defined as an angle that is formed by the direction of the central ray incident on the light reflecting surface and the direction of the reflected light entering the cover member 70 and that does not span over the light reflecting member, the reflection angle at the light reflecting surface of the first light reflecting member 50 for the first semiconductor laser element 20 is smaller than the reflection angle at the light reflecting surface of the second light reflecting member 60 for the second semiconductor laser element 30.

Figure 11:
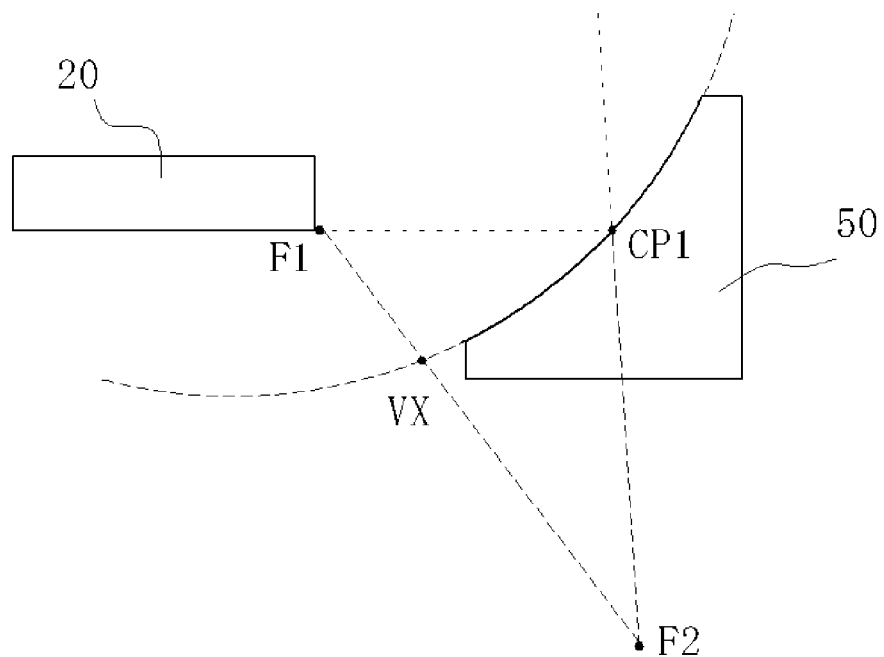
FIG. 11 is a diagram illustrating examples of the conditions met by the location of the first semiconductor laser element and the shape of the light reflecting surface of the first light reflecting member.

This takes into consideration the fact that the central ray of the first semiconductor laser element 20 is reflected at a position farther from the emission end surface in terms of the positional relationship between the CP1 and the CP2 described above. FIG. 11 shows an example of a specific layout in the case of making the region corresponding to the major diameter of light in the light reflecting surface of the first light reflecting member 50 a hyperbola. Assuming that the vertex of the hyperbola which forms the light reflecting surface is VX, the focus closer to the hyperbola is F1, and the other focus is F2, the emission position at the emission end surface of the first semiconductor laser element 20 is set at the focus F1. By setting the angle formed by the segment connecting the focus F1 with the position CP1 and the segment connecting the focus F2 with the position CP1 to that exceeding 90 degrees, the central ray can be reflected to form an acute angle with the optical axis as described above. The angle formed by the segment connecting the position CP1 with the focus F1 and the segment connecting the vertex VX with the focus F1 is smaller than 90 degrees.

The first to third lens parts are linked so as to have the same lens width LW, and the same center of the lens width LW, in the direction corresponding to the major diameters of light at the interface of the lens parts 82. In this manner, each lens part 82 can output collimated light having the same width in the direction corresponding to the major diameter of light at the interface of the lens part 82.
This can also align the exiting positions of the collimated beams in the direction corresponding to the major diameter of light at the interface for the lens parts 82.

The first to third lens parts are linked as described above, thus the central ray of the first semiconductor laser element 20 and the central rays of the second semiconductor laser elements 30 can be reflected by the light reflecting surfaces at the same angle. This can create the distance difference at the lens member 80 equivalent to the distance difference created at the light reflecting surfaces.

Accordingly, allowing the central ray of the first semiconductor laser element 20 to be reflected at a smaller angle as compared to the central ray of the second semiconductor laser elements 30 as described above can reduce the misalignment of the regions corresponding to the major diameters of the light beams emitted from the lens member 80 between the light beams emitted from the first semiconductor laser element 20 and the second semiconductor laser elements 30.

Specifically, with respect to the direction corresponding to the major diameters of the beams at the interface for the lens parts 82, the shapes of the light reflecting surfaces are designed such that the distance between the output point of the central ray of the first semiconductor laser element 20 and the output point of the central ray of a second semiconductor laser element 30 exiting the lens parts 82 is smaller than the distance between the irradiation point of the central ray of the first semiconductor laser element 20 and the irradiation point of the central ray of the second semiconductor laser element 30 in the light reflecting surfaces.

Moreover, the light reflecting surface of the first light reflecting member 50 is preferably designed to have a shape to control the travelling direction of the reflected light so as to maximize the amount of the light output through the first lens part 83, in other words, minimize the amount of the light not passing through the first lens part 83.

It is more preferably designed such that the lower end ray and the upper end ray from the first semiconductor laser element 20 fit in the lens width LW of the first lens part 83 at the interface of the first lens part 83 in the direction corresponding to the major diameter of the light at the interface of the first lens parts 83.
In other words, the lower end ray and the upper end ray from the first semiconductor laser element 20 preferably pass through the interface of the first lens part 83. The lower end rays and the upper end rays of the first semiconductor laser element 30 pass through the lens part 83 to exit. The same applies to the lower end rays and the upper end rays of the two second semiconductor laser elements 30 passing through the corresponding second and third lens parts 84 and 85.

As described above, the light emitting device 1 according to the first embodiment can reduce the spreading of the exiting light by reflecting the light beam from the first semiconductor laser element 20 using the first light reflecting member 50 and allowing the light to exit through the first lens part 83 of the lens member 80. This can narrow the beam that passes through the lens part 82, thereby allowing a smaller lens part 82 to control the travelling direction of light.

The light emitting device 1 according to the first embodiment is useful in the case of outputting collimated light while collecting the light in a small region. The light emitting device 1 according to the first embodiment can be utilized, for example, in the case of outputting collimated light so as to collect as much light as possible in a circular region having a diameter of a few millimeters.
Particularly, a light emitting device 1 according to the first embodiment, is capable of allowing 90% or more of the major portion of the light emitted from the first semiconductor laser element 20 having a vertical beam divergence angle in the range of from 55 degrees to 75 degrees to pass through the first lens part 83 having a lens width LW in the direction corresponding to the major diameter of light in the range of from 1.0 mm to 2.0 mm.

Second Embodiment

Figure 12:
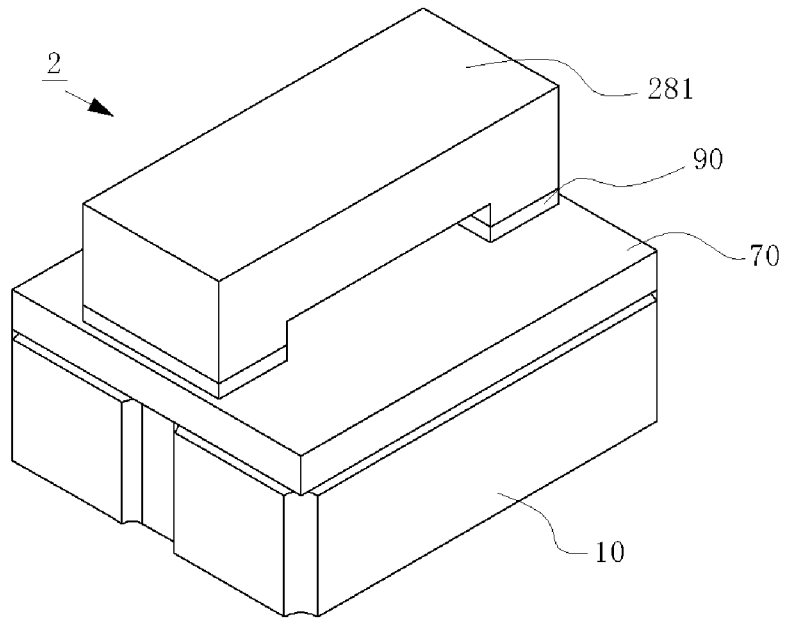
FIG. 12 is a perspective view of a light emitting device according to a second embodiment.
Figure 13:
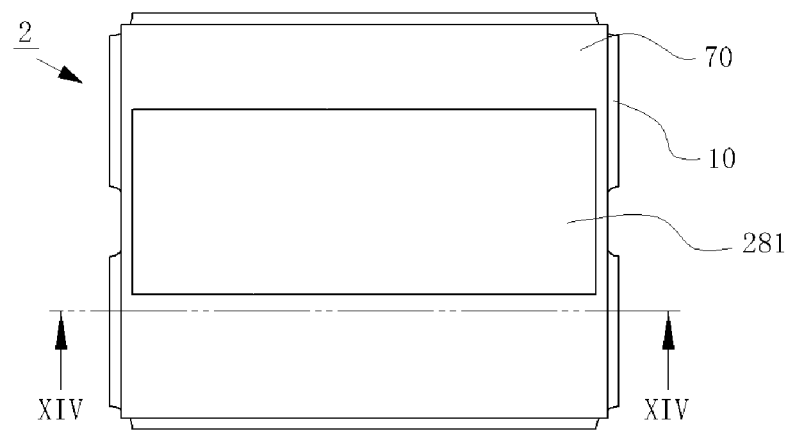
FIG. 13 is a top view of the light emitting device according to the second embodiment.
Figure 14:
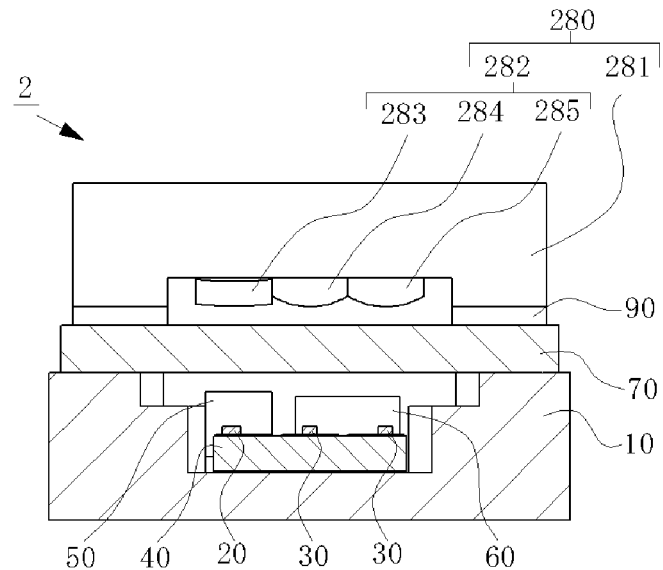
FIG. 14 is a cross-sectional view of the light emitting device according to the second embodiment taken along line XIV-XIV in FIG. 12.

A light emitting device 2 according to a second embodiment will be explained next. It is similar to the light emitting device 1 according to the first embodiment in terms of having the constituent elements such as a base, a single first semiconductor laser element, two second semiconductor laser elements, a submount, a first light reflecting member, a second light reflecting member, a cover member, a lens member, bonding parts, and wires. The differences from the first embodiment include the shape of the lens member 280 and the position of the surface where the lens part 282 is disposed. FIG. 12 is a perspective view of the light emitting device 2 viewed from the side from which light exits. FIG. 13 is a top view of the light emitting device 2 shown in FIG. 12 assuming that the side from which light exits is the upper surface. FIG. 14 is a cross-sectional view of the light emitting device 2 taken along line XIV-XIV in FIG. 12, The lens member 280 will be explained next.
The lens member 280 has three lens parts 282 each having a lens shape, and a non-lens part 281. The same shapes as those in the first embodiment can be employed for the three lens parts 282. The non-lens part 281 in the light emitting device 2 is a recessed structure different from that in the first embodiment which is a rectangular parallelepiped. The three lens parts 282 are disposed in the recess of the non-lens part 281.

The heights of the three lens parts 282 disposed in the recess from the interface are equal to the uppermost surface of the recessed structure from the interface. Being "equal" here includes a difference of up to 0.1 mm.
There may be a difference of more than 0.1 mm in the case where the height of a lens part 282 is smaller than the height of the uppermost surface of the recessed structure. That is, the heights of the three lens parts 282 from the interface are designed to be equal to or smaller than the height of the uppermost surface of the recessed structure from the interface. The heights of the lens parts 282 can be larger than the height of the uppermost surface of the recessed structure with an adjustment made by increasing the thickness of the bonding parts 90.

How the lens member 280 is installed in the light emitting device 2 will be explained next.

In the light emitting device 2, the lens member 280 is disposed so that the three lens parts 282 are disposed on the side that is closer to the upper surface of the cover member 70 so that the lens parts 282 face the cover member 70. Accordingly, the upper surfaces (i.e., lens surfaces) of the three lens parts 282 face down relative to the lens member 280 disposed above the base.

The uppermost surface of the recessed structure of the lens member 280 and the upper surface of the cover member 70 are joined together via an adhesive, which forms bonding parts 90. Assuming that the recessed side of the non-lens member 281 as the upper surface side and the opposing flat surface as the lower surface side, the lens member 280 is placed upside down such that the lower flat surface is located on the upper surface side of the light emitting device.

The three lens parts 282 are designed so as not to extend beyond the upper surface of the recessed non-lens part 281 as described above in order to avoid contact with the cover member 70. Designing them to contact the cover member 70 makes it difficult to adjust the positions and heights when and after bonding the lens member 280 to the cover member 70.

The three lens parts 282 of the lens member 280 are positioned to individually correspond to the three semiconductor laser elements disposed on the bottom part. That is, the upper surfaces (i.e., lens surfaces) of the three lens parts 282 are the incident surfaces through which the light beams emitted from the three semiconductor laser elements enter the lens member 280.

The first lens part 283, the second lens part 284, and the third lens part 285 are arranged to respectively collimate the light from the first semiconductor laser element 20, one of the two second semiconductor laser elements 30, and the other second semiconductor laser element 30, which is also in common with the light emitting device 1 of the first embodiment. Unlike the light emitting device 1 of the first embodiment in which the first to the third lens parts are disposed on the surface of the non-lens part 281 on the upper surface side of the light emitting device 1, they are disposed on the opposite surface of the non-lens part without changing the positions when viewed from above.

In the light emitting device 2 according to the second embodiment constructed as above, the beam path lengths until the light beams enter the lens parts 282 of the lens member 280 are smaller than those of the light emitting device 1 according to the first embodiment. The light beams entering the lens parts 282 are collimated, pass through the lens member 280, and exit from the non-lens part 281. A light beam reflected by a light reflecting surface of the light reflecting member is divergent, thus the smaller the beam path length, the smaller the divergence results. That is, the light emitting device 2 according to the second embodiment can attenuate the spreading of light beams passing through the lens parts as compared to the light emitting device 1 according to the first embodiment.

The first lens part 283 for the first semiconductor laser element 20 which has larger beam divergence angle than the second semiconductor laser elements 30 may be disposed on the surface of the lens member 280 closer to the cover member 70 while positioning the second and third lens parts on the surface of the lens member 280 opposing the surface closer to the cover member 70.

Third Embodiment

Figure 15:
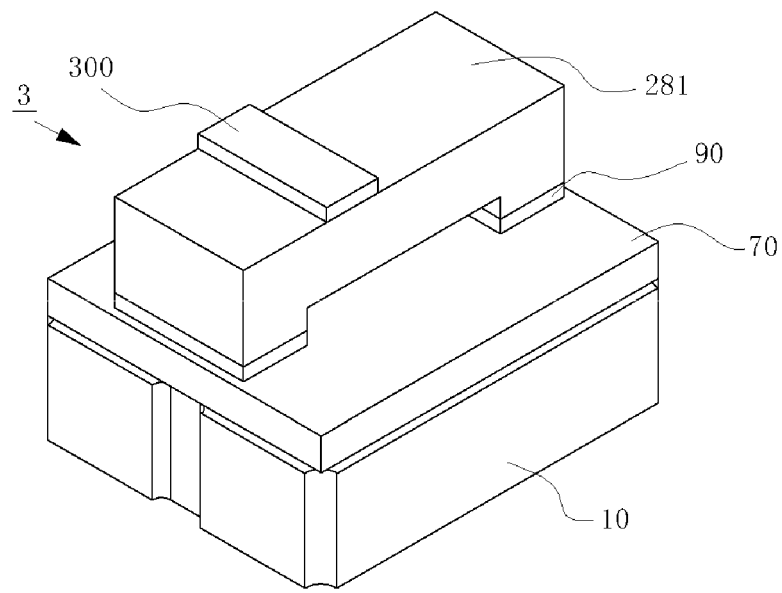
FIG. 15 is a perspective view of a light emitting device according to a third embodiment.
Figure 16:
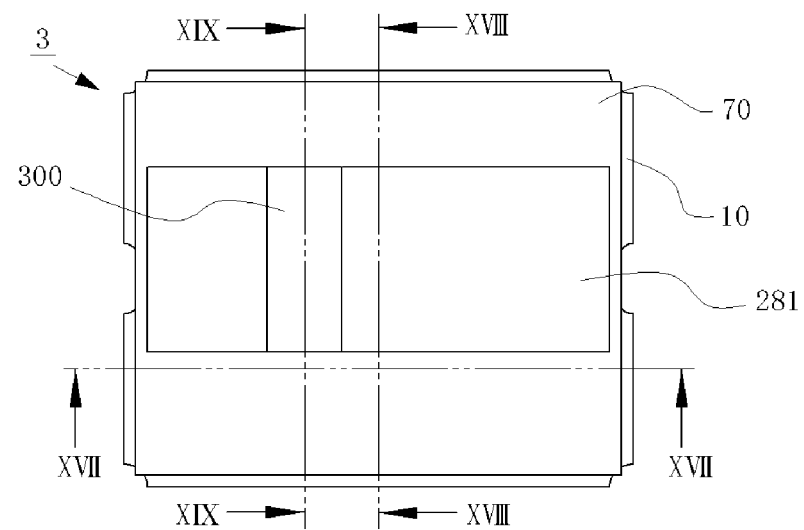
FIG. 16 is a top view of a light emitting device according to the third embodiment.
Figure 17:
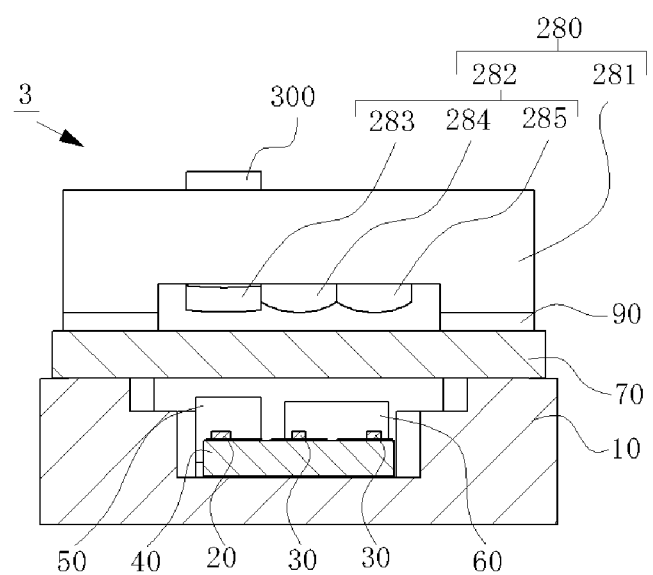
FIG. 17 is a cross-sectional view of the light emitting device according to the third embodiment taken along line XVII-XVII in FIG. 16.
Figure 18:
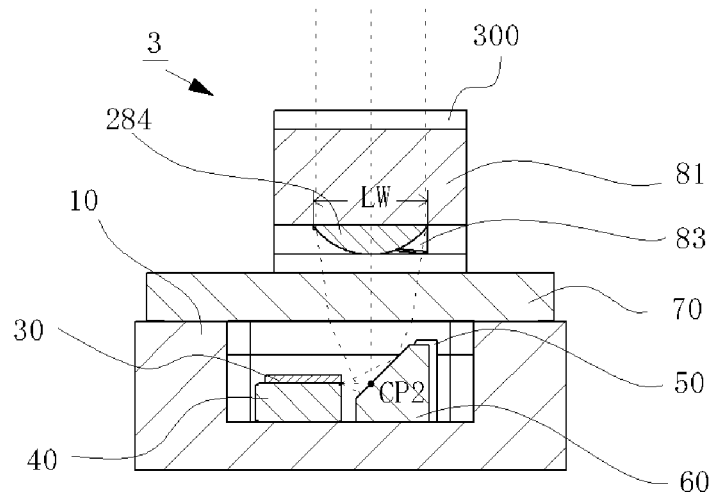
FIG. 18 is a cross-sectional view of the light emitting device according to the third embodiment taken along line XVIII-XVIII in FIG. 16.
Figure 19:
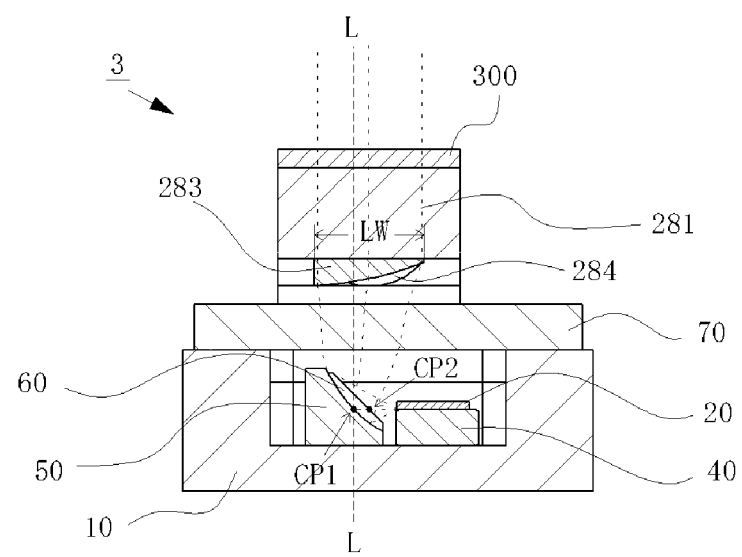
FIG. 19 is a cross-sectional view of the light emitting device according to the third embodiment taken along line XIX-XIX in FIG. 16.

A light emitting device 3 according to a third embodiment will be explained next. FIG. 15 is a perspective view of the light emitting device 3 viewed from the side from which light exits. FIG. 16 is a top view of the light emitting device 3 in FIG. 15 assuming that the side from which light exits is the upper surface. FIG. 17 is a cross-sectional view of the light emitting device 3 taken along line XVII-XVII in FIG. 16. FIG. 18 is a cross-sectional view of the light emitting device 3 taken along line in FIG. 16. FIG. 19 is cross-sectional view of the light emitting device 3 taken along line XIX-XIX in FIG. 16. The light emitting device 3 according to the third embodiment differs from the light emitting device 2 of the second embodiment in that it additionally includes a waveplate 300. For the waveplate 300, a half waveplate which changes the polarization direction of light by 90 degrees can be used.

The prior art, for example, Japanese Patent Publication No. 2017-212390, fails to address a light emitting device incorporating multiple light emitting elements having different polarization directions. On the other hand, the light emitting device 3 of the third embodiment can output light beams with the same polarization direction even though a plurality of light emitting elements emit light beams with different polarization directions.

The waveplate 300, moreover, has a flat plate shape. The waveplate 300 is a rectangle in a top view, but it does not have to be a rectangle, and for example, has a shape which is elongated in one direction such as an ellipse.

In the light emitting device 3, the waveplate 300 is provided in order to change the polarization direction of the light beam emitted from the first semiconductor laser element 20. Accordingly, the waveplate 300 is positioned in the region of the surface of the lens member 280 opposing the recessed surface where the first lens part 283 is disposed through which the light from the first semiconductor laser element 20 entering the first lens part 283 passes.

The light emitted from the first semiconductor laser element 20 exits from the light emitting device 3 after exiting from the lens member 280 and passing through the waveplate 300.

The lower surface of the waveplate 300 is bonded to the surface of the lens member 280 opposing the recessed surface where the first lens part 283 is disposed. Accordingly, in the light emitting device 3, the waveplate 300 is disposed above the lens member 280. In a top view, the length of the long sides of the waveplate 300 is closer to the length of the long sides than that of the short sides of the first lens part 283. In the light emitting device 3, the waveplate 300 is disposed by aligning the long sides of the waveplate 300 with the long sides of the first lens part 283.

The waveplate 300, moreover, is disposed in the position that covers the first lens part 283 in a top view. The waveplate 300 is disposed in the position and region covering the first lens part 283, but not covering the other lens parts, on a top view. Specifically, in the light emitting device 3, it is not positioned in the position covering the second lens part 284 or the third lens part 285 in a top view.

That is, the waveplate is not positioned in the paths of the beams from the semiconductor laser elements used as a reference to align the polarization direction, but the waveplate is positioned in the path of the beam from the semiconductor laser element misaligned with the reference polarization direction for the purpose of aligning the polarization direction.

The long-side length of the waveplate 300 in a top view is the same as, or greater than, the long-side length of the first lens part 283. Preferably, the long-side length is the same as, or smaller than, the length of the lens member 280 along the long sides of the first lens part 283. This allows the waveplate 300 to be disposed without projecting from the lens part 280. If the waveplate 300 projects from the lens part, a projected portion might be caught on something, which could cause the detachment of the waveplate 300.

The short-side length of the waveplate 300 is the same as, or greater than, the short-side length of the first lens part 283 in a top view. Preferably, it does not extend beyond the outer surface of the lens member 280 at the end in the direction approaching from the second lens part 283 to the first lens part 283 along the short sides of the first lens part 283, which is the direction extending in the short-side length of the first lens part 283. This allows the waveplate 300 to be disposed without projecting from the lens member 280 in a top view.

More preferably, it does not extend beyond the inner lateral surface of the recess of the lens member 280 at the end in the direction approaching form the second lens part 284 to the first lens member 283 along the short sides of the first lens part 283 in a top view, which is the direction extending in the short-side length of the first lens part 283. This allows the waveplate 300 to control the polarization direction of light without becoming too large in size.

The waveplate 300 is bonded to the lens member 280. A light transmissive resin adhesive, for example, can be used to bond the waveplate. A non-light transmissive adhesive can be used, but in this case the adhesive is preferably disposed in the areas other than the region through which light passes, so as not to interfere with the passage of light.

In the light emitting device 3, the polarization direction differs between the light from the first semiconductor laser element 20 and the light from the second semiconductor laser elements 30 by 90 degrees. For example, the first semiconductor laser 20 emits a p-polarized laser beam, and the second semiconductor laser elements emit a s-polarized laser beam from the respective emission end surfaces, Accordingly, allowing the light emitted from the first semiconductor laser element 20 to pass through the waveplate 300 can align the polarization direction of the light beams from the first and second semiconductor laser elements 20 and 30 exiting from the light emitting device 30. Accordingly, the waveplate 300 can be any that can eliminate the polarization direction misalignment.

According to the light emitting device 3 of the third embodiment, a light emitting device can be provided in which the polarization directions of the light beams emitted from the first and second semiconductor laser elements can be aligned before the beams are output.

By providing a waveplate 300 on the surface of the lens member 280 opposing the surface where the lens parts 282 are disposed as in the case of the light emitting device 3, a compact design light emitting device 3 capable of outputting light with aligned polarization direction can be produced. Because the structure of the light emitting device 3 allows collimated light to enter the waveplate 300, reflection loss at the surface of the waveplate 300 can be reduced as compared to cases where dispersed or collected light is allowed to enter.

Fourth Embodiment

A light emitting device according to a fourth embodiment will be explained. next. It is similar to the light emitting device 3 according to the third embodiment in terms of having constituent elements such as a base, a single first semiconductor laser element, two second semiconductor laser elements, two light reflecting members, a submount, a cover member, a lens member, bonding parts, wires, and a waveplate. On the other hand, it differs from the light emitting device 3 of the third embodiment in terms of the surface on which the lens member is disposed, the shape of the waveplate, the manner in which the lens member is bonded to the waveplate, and the shape of the light reflecting surface of the first light reflecting member.

Figure 20:
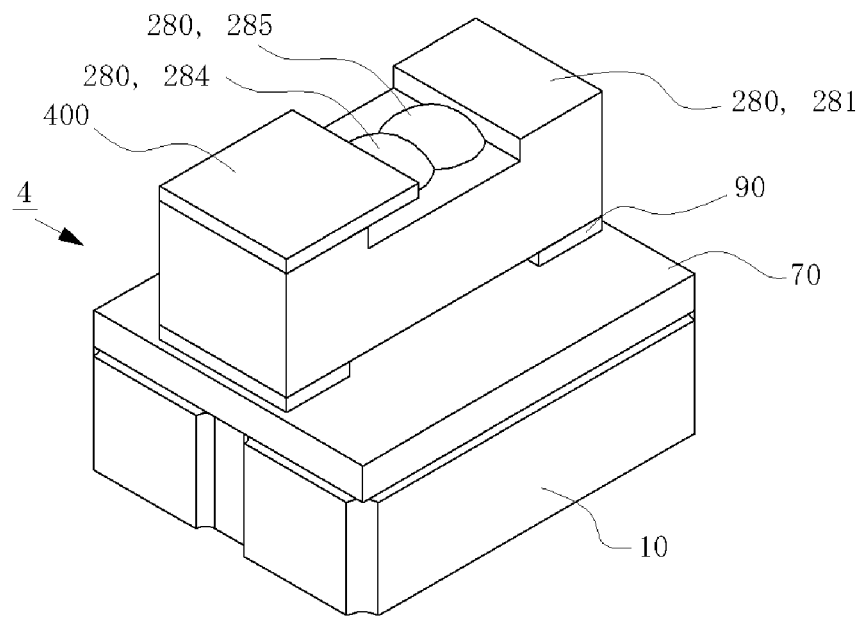
FIG. 20 is a perspective view of a light emitting device according to a fourth embodiment.
Figure 21:
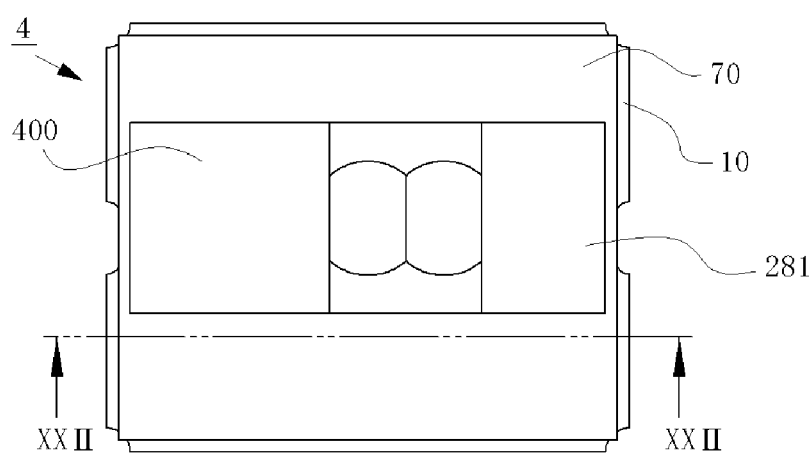
FIG. 21 is a top view of the light emitting device according to the fourth embodiment.
Figure 22:
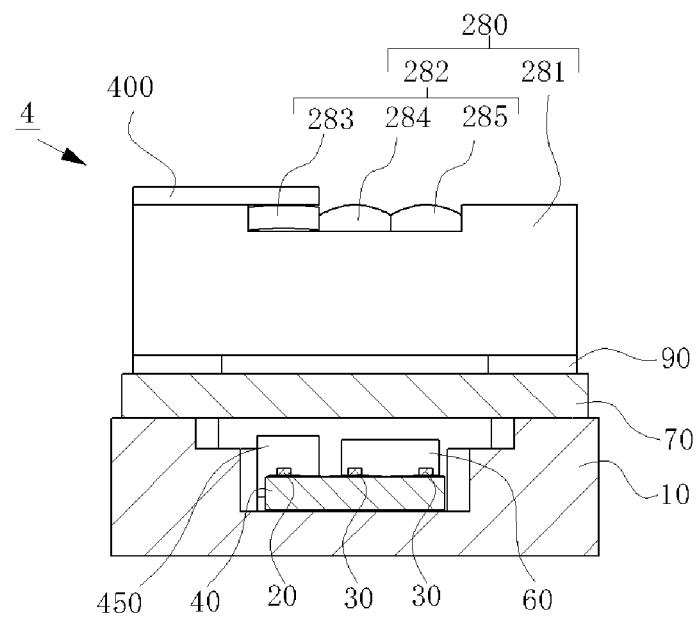
FIG. 22 is a cross-sectional view of the light emitting device according to the fourth embodiment taken along line XXII-XXII in FIG. 21.
Figure 23:
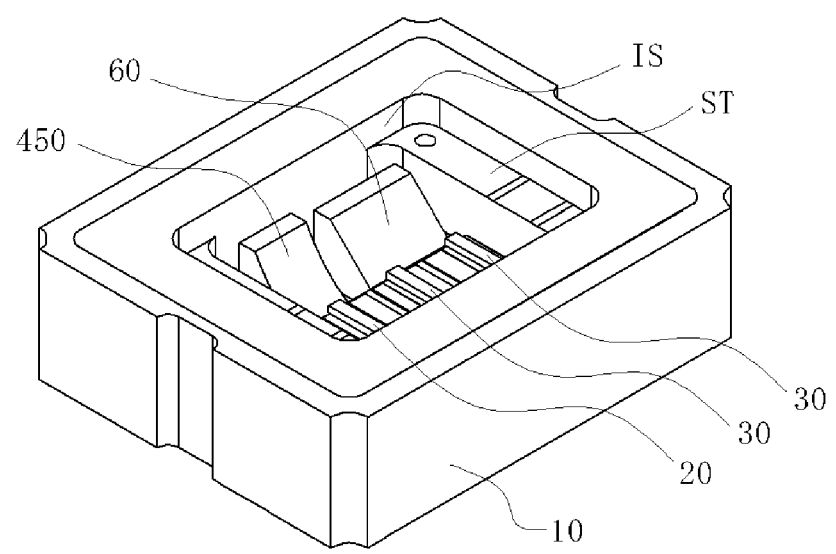
FIG. 23 is a perspective view of the light emitting device according to the fourth embodiment viewed in the same direction as in FIG. 20 with a portion of the structure removed.

FIG. 20 is a perspective view of the light emitting device 4 viewed from the side from which light exits. FIG. 21 is a top view of the light emitting device 4 shown in FIG. 20 assuming that the surface from which light exits is the upper surface. FIG. 22 is a cross-sectional view of the light emitting device 4 taken along line XXII-XXII in FIG. 21. FIG. 23 is a perspective view of the light emitting device 4 visualizing the space where the semiconductor laser elements are disposed by removing a portion of the structure when viewed in the same direction as in FIG. 20.

In the light emitting device 4, the lens member 280 is disposed such that the lens parts 282 of the lens member 280 are positioned on the surface opposing the surface that is bonded to the cover member 70. That is, the lens member 280 is positioned such that the three lens parts 282 are on the opposite side of the side that is closer to the upper surface of the cover member 70. Furthermore, the upper surfaces lens surfaces) of the three lens parts 282 surface up relative to the lens member 280 disposed above the base 10.

The lens member 280 is bonded to the cover member 70 via bonding parts 90 on the cover member 70. That is, the lower surface of the lens member 280 and the upper surface of the cover member 70 are bonded via an adhesive which forms the bonding parts 90. This allows the light beams emitted from the first and second semiconductor laser elements to enter the non-lens part 281 of the lens member 280 before being output from the lens parts 282 of the lens member 280.

In the light emitting device 4, when viewed while considering the recessed side of the non-lens part 281 as the upper surface side and the opposing flat surface as the lower surface side, the upper surface side of the lens member 280 is located on the upper surface side of the light emitting device 4 without turning the lens member 80 upside down as in the case of the light emitting device 3.

The three lens parts 282 of the lens member 280 are positioned to individually correspond to the semiconductor laser elements disposed on the bottom part of the base 10. That is, the upper surfaces (i.e., lens surfaces) of the three lens parts 282 become the surfaces from which the light beams of the three semiconductor laser elements passing through the lens member 280 are output.

The waveplate 400 is disposed to change the polarization direction of the light emitted from the first semiconductor laser element 20. The waveplate 400 is disposed on the lens member 80. The waveplate 400 is positioned on the surface on the side where the recess is formed in the lens member 280. In other words, the surface on the recessed side.

The waveplate 400 is disposed above the first lens part 283 of the lens member 280 in the region through which the light of the first semiconductor laser element 20 exiting from the first lens part 283 passes.

This allows the light emitted from the first semiconductor laser element 20 which enters the non-lens part 281 of the lens member 280 and exits from the first lens part 283 of the lens member 280 to enter the waveplate 400.

In the light emitting device 4, the waveplate 400 is bonded to the upper surface of the recessed non-lens part 281. More specifically, the waveplate 400 is bonded to the uppermost surface of the lens member 280 which is a recessed structure. In order to avoid contact between the waveplate 400 and the first lens part 283, at least, the distance (i.e., height) from the bonding surface between the lens member 280 and the cover member 70 to the first lens part 283 is preferably designed so as at least not to exceed the distance (i.e., height) from the bonding surface between the lens member 280 and the cover member 70 to the bonding surface between the recessed non-lens-part 281 and the waveplate 400.

To be bonded to the upper surface of the recessed non-lens member 281, the waveplate 400 is formed into a shape that can secure the portion to be bonded to the non-lens member 281. The waveplate 400 in the light emitting device 4 has a bonding portion bonded to the upper surface of the recessed non-lens part 281 and a non-bonding portion extending in the direction toward the first lens part 283 from the bonding portion.

This manner of bonding can eliminate a concern that the adhesive intrudes the beam passing region between the lens member 280 and the waveplate 400, thereby simplifying the mounting process.

The non-bonding portion is preferably not in contact with the first lens part 283. If in contact, the tolerances in forming the lens shape of the first lens part 283 can affect the mounting accuracy of the waveplate 400. The light output from the first lens part 283 of the lens member 280 enters and passes through the non-bonding portion of the waveplate 400. From a perspective of reduction in a light emitting device size, the waveplate 400 preferably fits within the outline of the lens member 280 in a top view.

The bonding portion of the waveplate 400 is the same size as, or larger than, the non-bonding portion. In order for more secure bonding of the waveplate, the waveplate 400 and the lens member 280 are preferably designed such that the bonding portion is larger. That is, the outline of the bonding surface of the lens member 280 is designed to be larger than the outline of the first lens part 283 when viewed from above. The bonding portion may be smaller than the non-bonding portion, but a smaller bonding portion can lead to unstable bonding.

The bonding surface of the recessed non-lens part 281 to be bonded to the waveplate 400 is provided on the side of the first lens part 283 along the direction of linking the first to third lens parts (i.e., the linking direction). When viewed from above, the bonding surface of the non-lens part 281 is located such that the first lens part 283 is interposed between the bonding surface of the non-lens part 281 and the second lens part 284.

In the light emitting device 4, the shape of the light reflecting surface of the first light reflecting member 450 is flat, but not curved. Similar to the first light reflecting member 450, the second light reflecting member 60 has a flat light reflecting surface. Employing a flat surface instead of a curved surface brings the position CP1 irradiated by the central ray of the first semiconductor laser element 20 closer to the position CP2 irradiated by the central ray of the second semiconductor laser element 30.

Similar to the first embodiment, the angle formed by the flat light reflecting surface and the bottom surface of the first light reflecting member 450 can be determined to allow the light to be more efficiently collimated at the spot where the light is collimated by the lens member 280. Accordingly, depending on the situation, the angle can be different from, or the same as, that set for the second light reflecting member 60.

Fifth Embodiment

A light emitting device 5 according to a fifth embodiment will be explained next. The constituent elements of the light emitting device 5 is similar to the light emitting device 4 according to the fourth embodiment in terms of including a base, a single first semiconductor laser element, two second semiconductor laser elements, a submount, a light reflecting member, a cover member, a lens member, bonding parts, wires, and a waveplate. On the other hand, the light emitting device 5 differs from the light emitting device 4 according to the fourth embodiment in terms of the shape of the lens member, the shape of the waveplate, the manner in which the lens member is bonded to the waveplate, and the number of light reflecting members.

Figure 24:
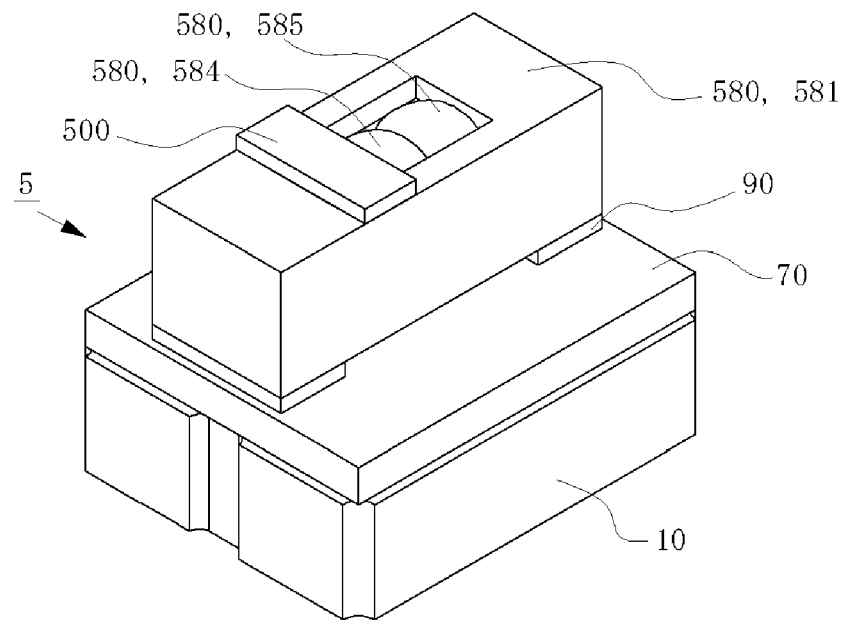
FIG. 24 is a perspective view of a light emitting device according to a fifth embodiment.
Figure 25:
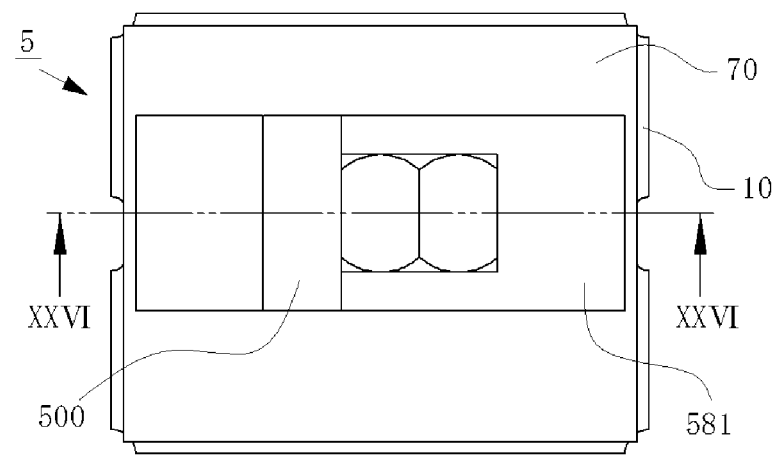
FIG. 25 is a top view of the light emitting device according to the fifth embodiment.
Figure 26:
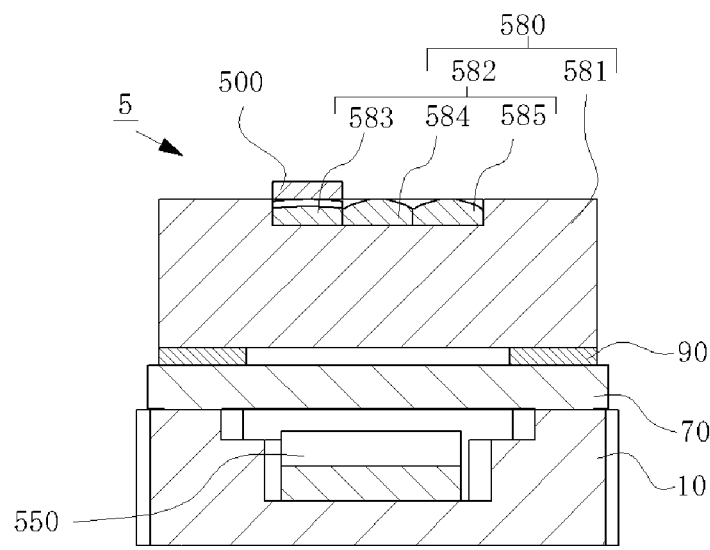
FIG. 26 is a cross-sectional view of the light emitting device according to the fifth embodiment taken along line XXVI-XXVI in FIG. 25.
Figure 27:
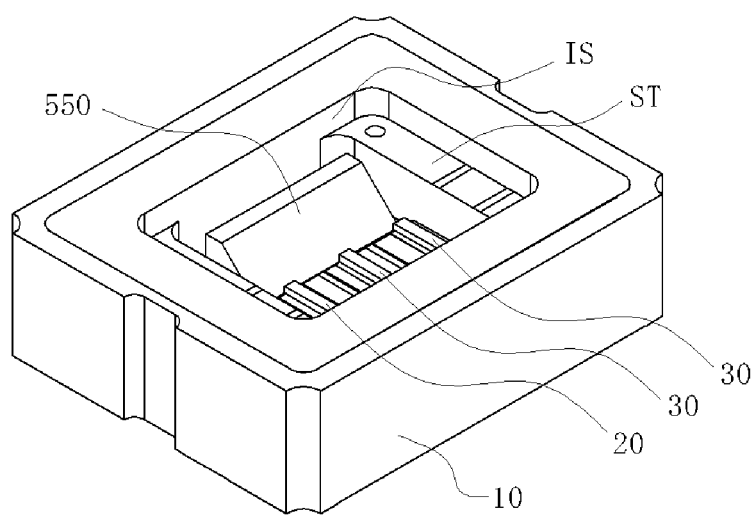
FIG. 27 is a perspective view of the light emitting device according to the fifth embodiment viewed in the same direction as in FIG. 24 with a portion of the structure removed.

FIG. 24 is a perspective view of the light emitting device 5 viewed from the side from which the light exits. FIG. 25 is a top view of the light emitting device 5 shown in FIG. 24 assuming that the side from which light exits is the upper surface. FIG. 26 is a cross-sectional view of the light emitting device 5 taken along line XXVI-XXVI in FIG. 25. FIG. 27 is a perspective view of the light emitting device 5 visualizing the space where the semiconductor laser elements are disposed by removing a portion of the structure when viewed in the same direction as in FIG. 24.

In the light emitting device 5, the recessed non-lens part 581 of the lens member 580 is formed to surround the lens parts 582. The recessed structure is formed such that upper surface portions on both sides of the first lens part 583 face the first lens part 583 in the non-linking direction, in addition to the direction of linking the first to third lens parts (i.e., the linking direction). The non-linking direction means the direction along which one lens part 582 is not linked to another lens part 582. That is, a straight line drawn in the linking direction intersects with only one lens part 582.

In the light emitting device 5, the waveplate 500 is bonded to the upper surface portions of the recessed structure located on both sides of the first lens part 583 in the non-linking direction. The bonding surface portions of the non-lens part 581 are located to interpose the first lens part 583 when viewed from above. The waveplate, on the other hand, does not contact the portions of the upper surface of the recessed structure located in the linking direction. It may be bonded to the portions that include one located in the linking direction.

The waveplate 500 has a first bonding portion which is bonded to the upper surface of the recessed non-lens part 581 on one side, a non-bonding portion extending from the bonding portion toward the first lens part 583, and a second bonding portion which is bonded to the upper surface of the recessed non-lens part 581 on the other side of the non-bonding portion.

According to this mariner of bonding, the waveplate 500 can be fixed in a more stable manner because it is bonded to the lens member at two locations spanning over the first lens part 583.

In the light emitting device 5, moreover, a single light reflecting member (i.e., the first light reflecting member 550) forms the light reflecting surface to reflect the light beams from the first and second semiconductor laser elements. The shape of the light reflecting surface is flat. The shape of the light reflecting surface may be curved. Constructing the light reflecting surface using a single first light reflecting member makes the beam path length to the position CPI irradiated by the central ray of the first semiconductor laser element 20 the same as the beam path lengths to the positions CP2 irradiated by the central rays of the second semiconductor laser elements 30.

Based on the light emitting devices 3 to 5 of the third to fifth embodiments explained above, at least the light emitting devices described below are disclosed.

A light emitting device includes a base having a bottom part, a first semiconductor laser element disposed on the bottom part of the base, one or more second semiconductor laser elements, a lens member, and a waveplate. The one or more second semiconductor laser elements are disposed on the bottom part of the base and each having a different polarization direction from that of the first semiconductor laser element. The lens member is a member into which the light beams from the first and second semiconductor laser elements enter.
The waveplate is disposed on the lens member to change the polarization direction of the light from the first semiconductor laser element.

In the light emitting device described above, the waveplate is disposed in the region through which the light from the first semiconductor laser element entering the lens member passes.

The above described lens member is formed with a recess. The lens member has one or more lens parts each having a lens shape and a non-lens part where the one or more lens parts are disposed in the recess.

The waveplate described above is disposed on the surface opposing the recessed-side surface of the lens member. The light from the first semiconductor laser element enters the lens part of the lens member, exits from the non-lens part of the lens member, and enters the waveplate.

The above described lens member is disposed above the base such that lens surfaces of the lens parts having lens shapes face down. The waveplate is disposed on the upper surface side of, and bonded to, the lens member.

The above described waveplate is disposed on the recessed-side surface of the lens member. Time light from the first semiconductor laser element enters the non-lens part, exits from the lens part of the lens member, and enters the waveplate.

The above described waveplate is disposed on the uppermost surface of the recessed lens member.

The above described lens member is disposed above the base such that the lens surfaces of the lens parts face up. The waveplate is disposed on the upper surface side of, and bonded to, the lens member.

The above described light emitting device further includes a cover member bonded to the base to seal the space in which the first and second semiconductor laser elements are disposed. The lens member is bonded to the cover member.

Design Example 1

A specific design example of the light emitting device according to the first embodiment will be described next. A red light emitting first semiconductor laser element having a vertical beam divergence angle of about 65 degrees, a green light emitting second semiconductor laser element having a vertical beam divergence angle of about 46 degrees, and a blue light emitting second semiconductor laser element having a vertical beam divergence angle of about 45 degrees are disposed on the bottom part.

The distance from the submount provided with the first and second semiconductor laser elements to the first and second light reflecting members is 0.15 mm. The height from the surface of the base on which the submount is disposed to the cover member is 1.00 mm. The height from the surface of the base on which the submount is disposed to the surface of the submount on which the first and second semiconductor laser elements are disposed is 0.40 mm. The height from the surface of the base on which the first light reflecting member is disposed to the light reflecting surface is 0.16 mmm at minimum and 0.85 mm at maximum, The height from the surface of the base on which the second light reflecting member is disposed to the light reflecting surface is 0.25 mm at minimum and 0.80 mm at maximum. The thickness of the cover member (i.e., the height from the bottom surface to the upper surface of the cover member) is 0.50 mm. The thickness of the bonding parts is 0.2 mm. The thickness of the non-lens part of the lens member (i.e., the height from the bottom surface of the lens member to the interface with the lens parts) is 1.40 mm. The thickness of each lens part (i.e., the height from the interface with the non-lens part to the vertex of the lens shape) is 0.3 mm. The lens width of each of the first to third lens parts of the lens member is 1.20 mm.

The distance from the emission end surface of the first semiconductor laser element to the position on the light reflecting surface irradiated by the central ray from the first semiconductor laser element is 0.47 mm. The distance from the end surface of each second semiconductor laser element to the position on the light reflecting surface irradiated by the central ray from the second semiconductor laser element is 0.30 mm. The beam divergence angle of he reflected light of the first light reflecting member in the vertical direction is 8.3 degrees.

In such a light emitting device, assuming that the width corresponding to the major diameter is 1.0 mm, the collimated light output from the lens member was calculated to have 90% or more of the light emitted from a semiconductor laser element in that width.

The present disclosure has been described above. The light emitting devices according to the present invention having the technical features disclosed in the description herein are not limited to the structures of the light emitting devices 1 to 5 explained with reference to these embodiments. For example, the present invention is applicable to a light emitting device having a constituent not disclosed in any of the embodiments. As such, the mere fact that there is a difference from the disclosed light emitting devices would not provide any ground for the inapplicability of the present invention.

It goes without saying that, even in the case where a light emitting device according to one embodiment which includes a modified element by incorporating, or replacing with, a part of the constituents disclosed in another embodiment, so long as such a modification is merely a matter of design choice for a person of ordinary skill in the art, the device would essentially fall within the scope of the present invention.

In other words, the present invention is applicable to a device even if it is not essential for the device to necessarily and fully include all of the constituent elements of the light emitting device disclosed by any of the embodiments. For example, in the event that a certain constituent element of a light emitting device disclosed by any of the embodiments is not disclosed in the claim scope, we claim the applicability of the invention disclosed in the claim scope by recognizing the design flexibility for a person of ordinary skill in the art for such a constituent through the use of an alternative, an omission, a shape change, a change in the materials employed, or the like, without limiting it to what is disclosed in the embodiment.

The light emitting devices described in the embodiments of the present invention can be used as light sources for head-mounted displays, projectors, automotive headlights, lighting fixtures, display backlights, and the like.

What is claimed is:

1. A light emitting device comprising:
   a base having a bottom part;
   a first semiconductor laser element disposed on the bottom part of the base;
   a second semiconductor laser element disposed on the bottom part of the base, the second semiconductor laser element having a different polarization direction from a polarization direction of the first semiconductor laser element;
   a lens member into which light beams from the first semiconductor element and the second semiconductor laser element enter, the lens member having a lower surface joined with the base and a lens surface, the lens surface being positioned so as not to protrude toward the bottom part of the base beyond the lower surface; and
   a waveplate configured to change the polarization direction of light from the first semiconductor laser element, wherein
   the base has a frame part forming a lateral surface surrounding the first semiconductor laser element and the second semiconductor laser element,
   the base supports the lens member and the waveplate,
   the lens member has a first lens part, a second lens part and a non-lens part, each of the first lens part and the second lens part having a lens shape and respectively corresponding to the first semiconductor laser element and the second semiconductor laser element,
   the non-lens part defines a recess, and the first lens part and the second lens part are disposed in the recess of the non-lens part, and
   a lower surface of the waveplate is positioned on a surface of the lens member on a side where the recess is defined.

2. The light emitting device according to claim 1, wherein the first lens part and the second lens part are arranged to respectively collimate the light from the first semiconductor laser element and the second semiconductor laser element.

3. The light emitting device according to claim 1, further comprising
   a third semiconductor laser element disposed on the bottom part of the base, wherein
   the first semiconductor laser element, the second semiconductor laser element, and the third semiconductor laser element are arranged side by side, and
   the first semiconductor laser element is arranged at one end among the first semiconductor laser element, the second semiconductor laser element, and the third semiconductor laser element.

4. The light emitting device according to claim 1, further comprising
   a cover member bonded to the base, wherein
   the lens member is bonded to the cover member, and
   the waveplate covers an emission end surface of the first semiconductor laser element in a top view.

5. The light emitting device according to claim 1, wherein the waveplate covers the first lens part in a top view, and the waveplate does not cover the second lens part in the top view.

6. The light emitting device according to claim 1, wherein
   a long-side length of the waveplate in a top view is the same as, or greater than, a long-side length of the first lens part in the top view, and
   a short-side length of the waveplate is the same as, or greater than, a short-side length of the first lens part in the top view.

7. The light emitting device according to claim 1, wherein the waveplate has a bonding portion bonded to an upper surface of the non-lens part on the side where the recess is defined, and the waveplate has a non-bonding portion extending in a direction toward the first lens part from the bonding portion.

8. The light emitting device according to claim 7, wherein the bonding portion of the waveplate is the same size as, or larger than, the non-bonding portion.

9. A light emitting device comprising:
   a base having a bottom part;
   a first semiconductor laser element disposed on the bottom part of the base;
   a second semiconductor laser element disposed on the bottom part of the base, the second semiconductor laser element having a different polarization direction from a polarization direction of the first semiconductor laser element
   a lens member into which light beams from the first semiconductor element and the second semiconductor laser element enter, the lens member having a lower surface joined with the base and a lens surface, the lens surface being positioned so as not to protrude toward the bottom part of the base beyond the lower surface; and
   a waveplate configured to change the polarization direction of light from the first semiconductor laser element, wherein
   the base has a frame part forming a lateral surface surrounding the first semiconductor laser element and the second semiconductor laser element,
   the base supports the lens member and the waveplate,
   the lens member has a first lens part, a second lens part and a non-lens part, each of the first lens part and the second lens part having a lens shape and respectively corresponding to the first semiconductor laser element and the second semiconductor laser element,
   the non-lens part defines a recess, and the first lens part and the second lens part are disposed in the recess of the non-lens part, and
   the waveplate has a first bonding portion which is bonded to an upper surface of the non-lens part on a side where the recess is defined, a non-bonding portion extending from the bonding portion toward the first lens part, and a second bonding portion which is bonded to the upper surface of the non-lens part on the other side of the non-bonding portion.

10. The light emitting device according to claim 1, further comprising
    a cover member having a lower surface bonded to the base and an upper surface bonded to the lens member, wherein
    the lens member is joined with the base via the cover member.

* * * * *